(12) United States Patent
Harada et al.

(10) Patent No.: US 9,756,755 B2
(45) Date of Patent: Sep. 5, 2017

(54) ELECTRIC POWER CONVERTER

(71) Applicant: DENSO CORPORATION, Kariya, Aichi-pref. (JP)

(72) Inventors: Naohisa Harada, Kariya (JP); Akira Nakasaka, Kariya (JP)

(73) Assignee: DENSO CORPORATION, Kariya (JP)

( * ) Notice: Subject to any disclaimer, the term of this patent is extended or adjusted under 35 U.S.C. 154(b) by 0 days.

(21) Appl. No.: 14/923,856

(22) Filed: Oct. 27, 2015

(65) Prior Publication Data

US 2016/0128216 A1 May 5, 2016

(30) Foreign Application Priority Data

Oct. 31, 2014 (JP) .................................. 2014-223069
May 8, 2015 (JP) .................................. 2015-095768

(51) Int. Cl.
*H05K 7/00* (2006.01)
*H05K 7/14* (2006.01)

(52) U.S. Cl.
CPC .................................. *H05K 7/1432* (2013.01)

(58) Field of Classification Search
CPC ............................ H05K 7/1432; H02M 7/003
USPC ......................................... 361/728–730, 752
See application file for complete search history.

(56) References Cited

U.S. PATENT DOCUMENTS

| | | | | |
|---|---|---|---|---|
| 2011/0194247 A1* | 8/2011 | Nakasaka | ........... | H01L 23/4093 361/689 |
| 2012/0300521 A1* | 11/2012 | Hida | ................... | H05K 7/20927 363/131 |
| 2013/0028001 A1* | 1/2013 | Yokota | ................... | H02M 7/003 363/144 |
| 2013/0058068 A1* | 3/2013 | Funatsu | ............. | H05K 7/20927 361/820 |
| 2014/0118909 A1* | 5/2014 | Matsuno | ............... | H02M 7/003 361/679.01 |
| 2014/0185266 A1* | 7/2014 | Iwata | .................... | H02M 7/003 361/820 |

FOREIGN PATENT DOCUMENTS

JP   2010-183748 A   8/2010

* cited by examiner

*Primary Examiner* — Hung S Bui
(74) *Attorney, Agent, or Firm* — Oliff PLC

(57) ABSTRACT

An electric power converter includes a semiconductor module, a capacitor, and a DC bus bar that electrically connects them. The capacitor has a capacitor element and a capacitor terminal connected to the capacitor element. The capacitor terminals and the DC bus bar are connected to each other at least at two connecting portions. The DC bus bar has a bus bar main body portion that is connected to the semiconductor module. The two connecting portions are connected by at least a portion of the bus bar main body portion. The capacitor terminal has a terminal main body portion that is connected to the capacitor element. The two connecting portions are connected by at least a portion of the terminal main body portion.

5 Claims, 22 Drawing Sheets

ELECTRIC POWER CONVERTER

CROSS-REFERENCE TO RELATED APPLICATION

This application is based on and claims the benefit of priority from earlier Japanese Patent Applications No. 2014-223069 filed Oct. 31, 2014, and No. 2015-95768 filed May 8, 2015, the descriptions of which are incorporated herein by reference.

TECHNICAL FIELD

The present disclosure relates to an electric power converter that includes a semiconductor module having a built-in semiconductor element, a capacitor, and a DC bus bar that electrically connects them.

BACKGROUND

As an electric power converter that performs power conversion between DC power and AC power, one that includes semiconductor modules having built-in semiconductor elements, a capacitor, and a pair of DC bus bars that electrically connect them has been known (refer to Japanese Patent Publication No. 2010-183748).

In the electric power converter, voltage of a DC power source is smoothed by using the capacitor.

Then, it is configured to convert the DC power supplied from the DC power source to the AC power by switch-operating the semiconductor elements.

The capacitor includes capacitor elements and capacitor terminals connected to the capacitor elements.

The DC bus bars are connected to the capacitor terminals.

In the above electric power converter, a respective DC bus bar and the capacitor terminal are connected by using bolts or the like only at one position.

However, there is a possibility that a large parasitic inductance may occur on the DC bus bars and the capacitor terminals in the above electric power converter.

That is, the respective DC bus bar and the capacitor terminal are connected only at one position in the above electric power converter.

Therefore, a current flowing between the DC bus bar and the capacitor terminal always passes through a single connecting portion, thus there is only one path where the current flows.

When the number of current paths is small, a large inductance is likely to parasitize.

Therefore, there is a possibility that a large inductance might parasitize to the DC bus bars and the capacitor terminals in the above electric power converter.

As a result, it is considered that there is a possibility that a relatively large surge occurs due to the inductance when switch-operating the semiconductor elements.

SUMMARY OF THE DISCLOSURE

An embodiment provides an electric power converter that can further reduce an inductance that parasitizes on a DC bus bar and a capacitor terminal.

In an electric power converter according to a first aspect, the electric power converter includes a semiconductor module having a built-in semiconductor element, a capacitor having a capacitor element and a capacitor terminal connected to the capacitor element, and a DC bus bar that electrically connects the semiconductor module and the capacitor terminal.

The capacitor terminal and the DC bus bar are connected to each other at least at two connecting portions.

The DC bus bar includes a bus bar main body portion that is connected to the semiconductor module, and the two connecting portions are connected by at least a portion of the bus bar main body portion.

The capacitor terminal includes a terminal main body portion that is connected to the capacitor element, and the two connecting portions are connected by at least a portion of the terminal main body portion.

In the above electric power converter, the DC bus bar and the capacitor terminal are connected to each other at least at two connecting portions.

The DC bus bar includes the bus bar main body portion that is connected to the semiconductor module, and the two connecting portions are connected by at least a portion of the bus bar main body portion.

In addition, the capacitor terminal includes the terminal main body portion that is connected to the capacitor element, and the two connecting portions are connected by at least a portion of the terminal main body portion.

Therefore, it is possible to further reduce the inductance that parasitizes on the DC bus bar and the capacitor terminal.

That is, by adopting the above configuration, the current flowing between the semiconductor module and the capacitor element can be divided into at least two current paths to flow the path passing through one of the connecting portions and the other path passing through the other one of the connecting portions among two connecting portions.

Therefore, it is possible to increase the number of current paths.

Although the parasitic inductance to the individual current path, these inductances are connected in parallel with each other.

Therefore, a value of the total inductances obtained by combining a plurality of inductances is smaller than a value of each inductance.

As a result, it is possible to reduce the inductance that parasitizes on the DC bus bar and the capacitor terminal (combined inductance), and when the semiconductor elements are turned on and off, it is possible to prevent the large surge caused by the inductance from occurring.

As described above, according to the present disclosure, it is possible to provide the electric power converter that can further reduce the inductance that parasitizes on the DC bus bar and the capacitor terminal.

DETAILED DESCRIPTION OF THE PREFERABLE EMBODIMENTS

An above-mentioned electric power converter can be defined as an on-vehicle electric power converter for mounting on a vehicle such as an electric vehicle or a hybrid vehicle.

Embodiments

First Embodiment

An embodiment according to an electric power converter will be described with reference to FIGS. 1 to 12.

Figure 1:
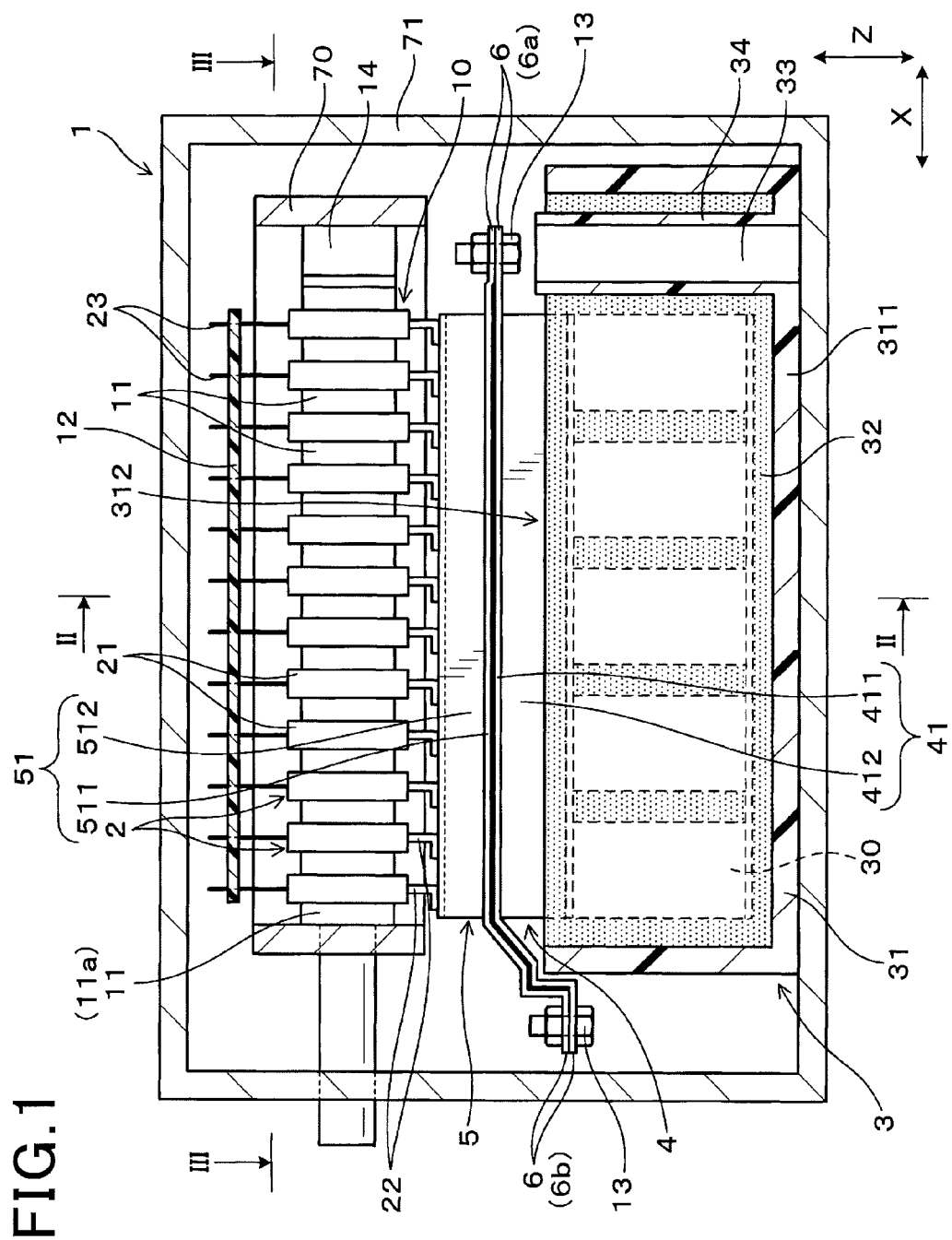
FIG. 1 is a sectional view of an electric power converter, and is a sectional view taken along the line I-I of FIG. 2 in a first embodiment.

As shown in FIG. 1, an electric power converter 1 of the present embodiment includes semiconductor modules 2, a capacitor 3, and DC bus bars 5 (5p, 5n).

Figure 8:
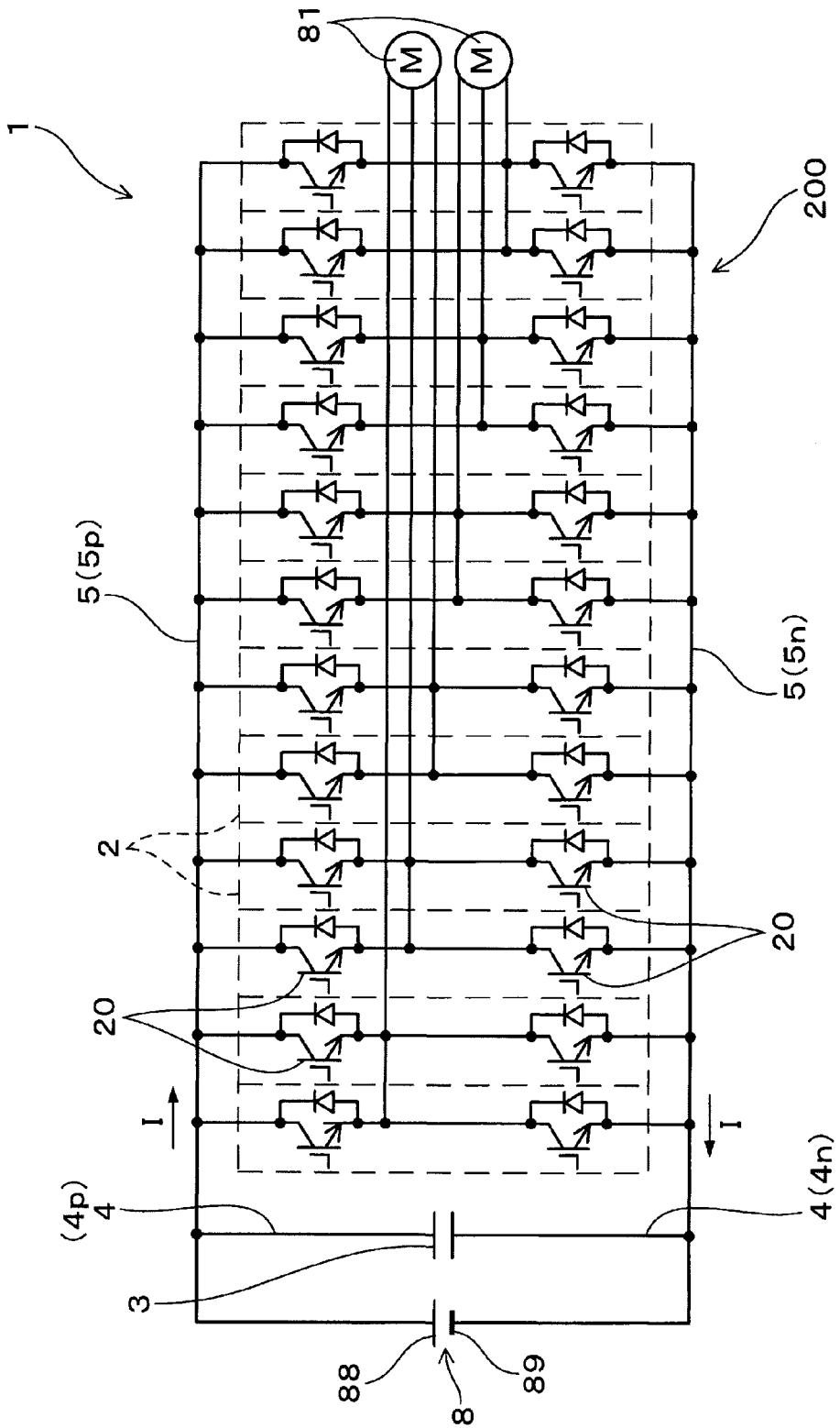
FIG. 8 shows a circuit diagram of the electric power converter in the first embodiment.

Each semiconductor module 2 incorporates semiconductor elements 20 therein (refer to FIG. 8).

The capacitor 3 has capacitor elements 30 and capacitor terminals 4 connected to the capacitor elements 30.

The DC bus bars 5 (5p, 5n) electrically connect between the semiconductor modules 2 and the capacitor terminals 4.

The capacitor terminals 4 and the DC bus bars 5 are connected to each other at two connecting portions 6 (a first connecting portion 6a and a second connecting portion 6b).

The DC bus bars 5 have bus bar main body portions 51 connected to the semiconductor modules 2.

Two connecting portions 6a, 6b are connected by parts of the bus bar main body portions 51.

In addition, the capacitor terminals 4 have terminal main body portions 41 that are connected to the capacitor elements 30.

Two connecting portions 6a, 6b are connected by parts of the terminal main body portions 41.

The electric power converter of the present embodiment is an on-vehicle electric power converter for mounting on a vehicle such as an electric vehicle or a hybrid vehicle.

Figure 2:
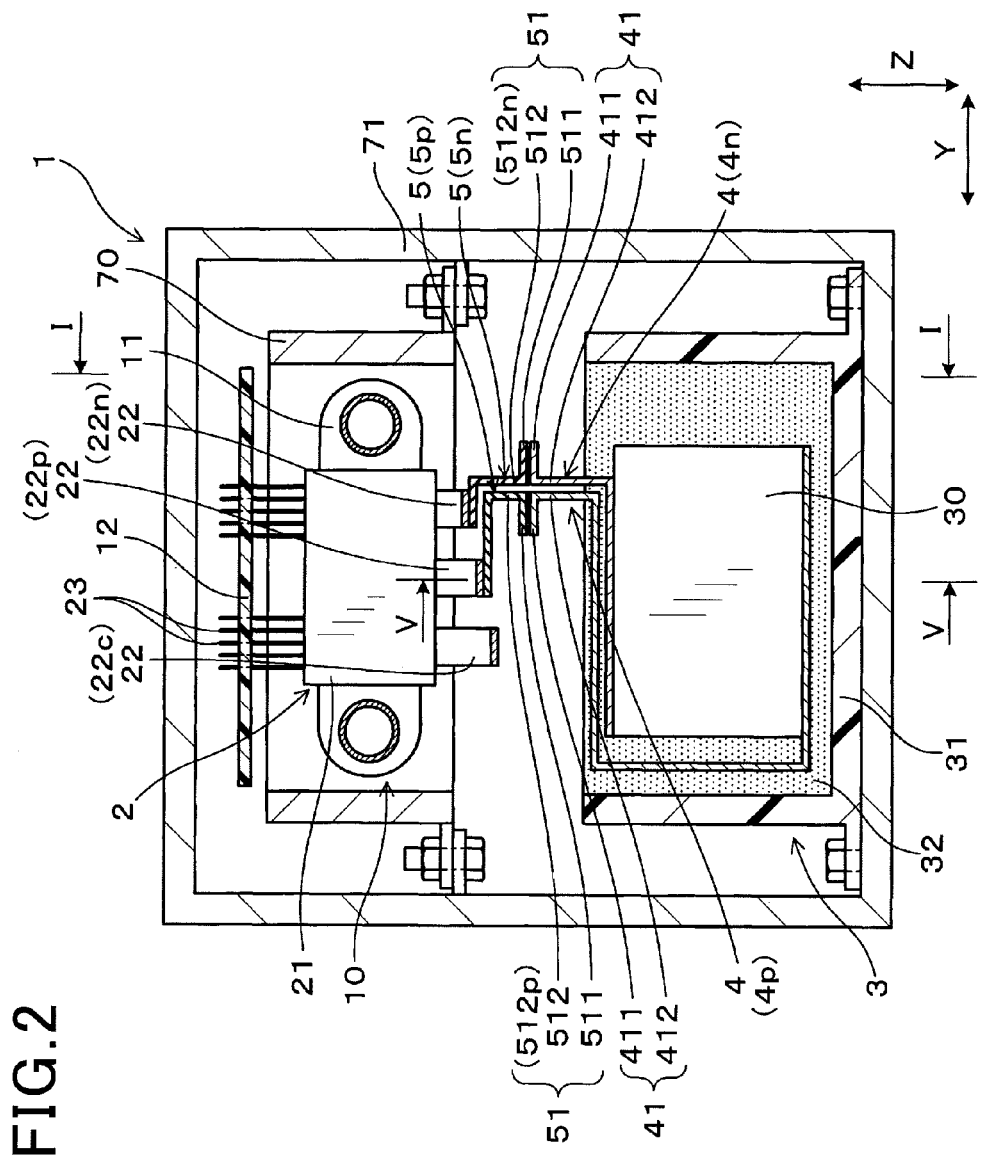
FIG. 2 shows a sectional view taken along the line II-II of FIG. 1.

As shown in FIG. 2, the capacitor 3 includes two capacitor terminals 4 (4p, 4n) that are a positive side capacitor terminal 4p electrically connected to a positive electrode 88 of a DC power source 8 and a negative side capacitor terminal 4n electrically connected to a negative electrode 89 of the DC power source 8 (refer to FIG. 8).

The electric power converter 1 further includes two DC bus bars 5 (5p, 5n) that are a positive side DC bus bar 5p connected to the positive side capacitor terminal 4p and a negative side DC bus bar 5n connected to the negative side capacitor terminal 4n.

Moreover, as shown in FIG. 1, a laminated body 10 is formed by laminating a plurality of semiconductor modules and a plurality of cooling pipes 11 for cooling the semiconductor modules 2 in the present embodiment.

Figure 4:
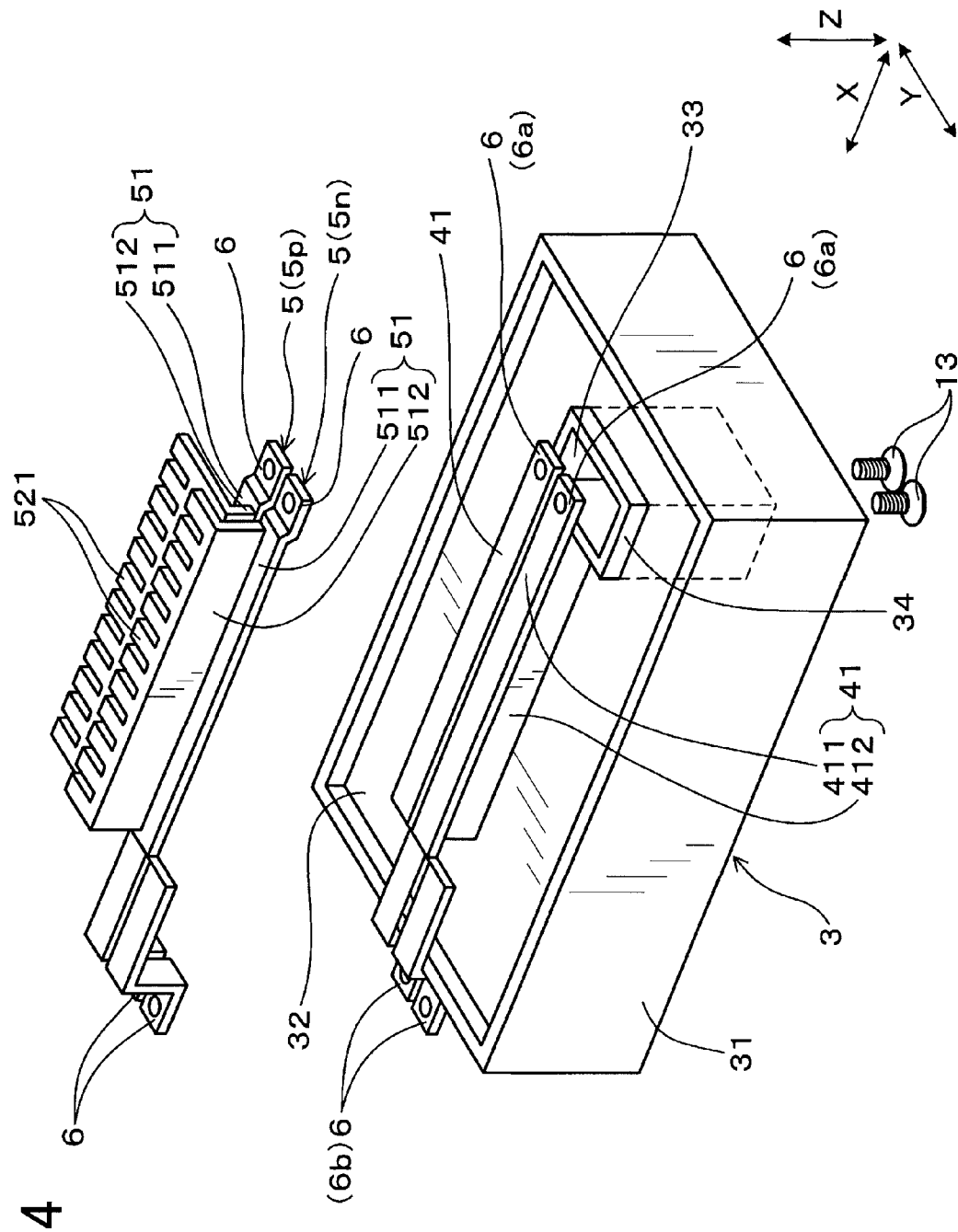
FIG. 4 shows a perspective view of DC bus bars and a capacitor in the first embodiment.

As shown in FIG. 1 and FIG. 4, each bus bar main body portion 51 includes a bus bar connecting portion 511 for connecting two connecting portions 6a, 6b, and a bus bar standing portion 512 standing from the bus bar connecting portion 511.

Each bus bar connecting portion 511 has a long elongated shape in a laminating direction of the laminated body 10 (X direction).

Each bus bar standing portion 512 is standing on the bus bar connecting portion 511 on the semiconductor module 2 side in a thickness direction of the connecting part 6 (Z direction).

Moreover, each terminal main body portion 41 includes a terminal connecting portion 411 for connecting two connecting portions 6a, 6b, and a terminal standing portion 412 standing from the terminal connecting portion 411.

Each terminal standing portion 412 has a long elongated shape in the X direction.

Each terminal standing portions 412 is standing on the terminal connecting portions 411 on the capacitor elements 30 side in the Z direction.

As shown in FIG. 2, the bus bar standing portions 512 (512p, 512n) respectively formed on two DC bus bars 5p, 5n are arranged next to each other at predetermined intervals.

As shown in FIG. 8, an inverter circuit 200 is constituted by a plurality of semiconductor modules 2 in the present embodiment.

DC power supplied from the DC power source 8 is converted into AC power by switch-operating the semiconductor elements 20 (IGBT elements) built in the respective semiconductor modules 2.

Then, a three-phase AC motor 81 is driven by using the obtained AC power, thereby drives the vehicle.

As shown in FIG. 2, the capacitor 3 includes the capacitor elements 30, a capacitor case 31 for housing the capacitor elements 30, a sealing member 32 for sealing the capacitor elements 30 in the capacitor case 31, and the capacitor terminals 4.

Figure 6:
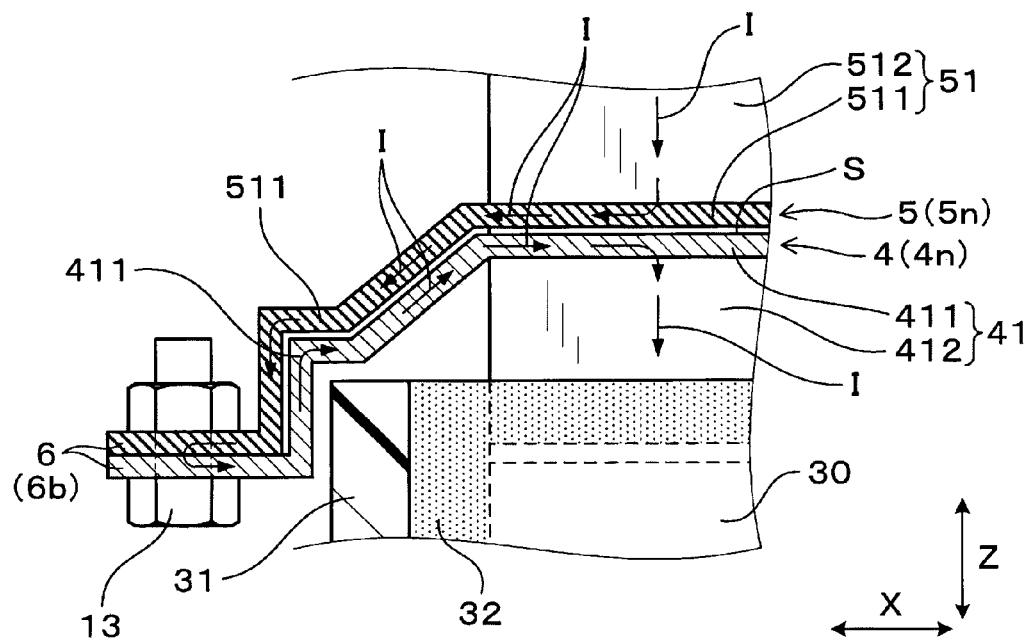
FIG. 6 shows an enlarged sectional view of a vicinity of a second connecting portion of the electric power converter in the first embodiment.
Figure 7:
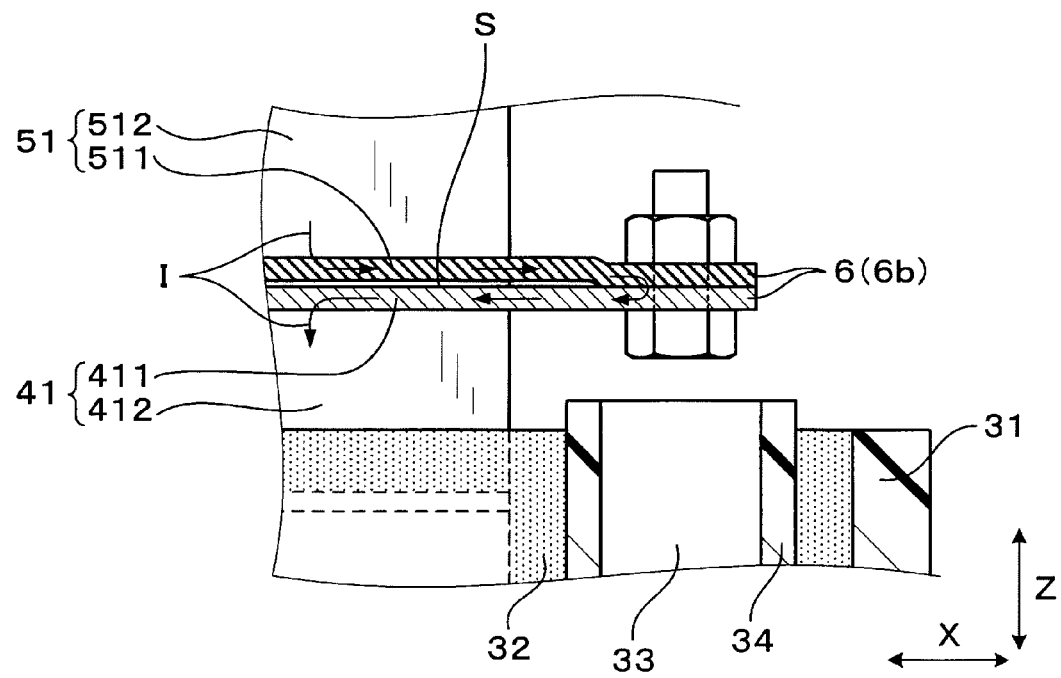
FIG. 7 shows an enlarged sectional view of a vicinity of a first connecting portion of the electric power converter in the first embodiment.

As shown in FIG. 6 and FIG. 7, the bus bar connecting portion 511 and the terminal connecting portion 411 are overlapped with each other in the present embodiment.

A space S is formed between the bus bar connecting portion 511 and the terminal connecting portion 411.

Therefore, a path where a current I flows is divided into two paths; namely a path passing through one of the connecting portions 6a and another path passing through the another one of the connecting portions 6b among two connecting portions 6a, 6b.

In addition, a direction of the current I flowing through the bus bar connecting portion 511 and a direction of the current I flowing through the terminal connecting portion 411 become opposite to each other.

In addition, as shown in FIG. 1 and FIG. 4, a tubular portion 34 is formed in the capacitor case 31 in the present embodiment.

A through hole 33 is formed in the tubular portion 34.

The through hole 33 penetrates in the Z direction from a bottom wall portion 311 to an opening 312 of the capacitor case 31 (refer to FIG. 1).

The first connecting portion 6a is formed at a position overlapping the through hole 33 in the Z direction.

When manufacturing the electric power converter 1, the first connecting portions 6a are fastened by inserting a fastening member 13 into the through hole 33 from the bottom wall portion 311 side as described later in the present embodiment.

Moreover, the second connecting portions 6b are formed on an outside of the capacitor case 31.

Figure 3:
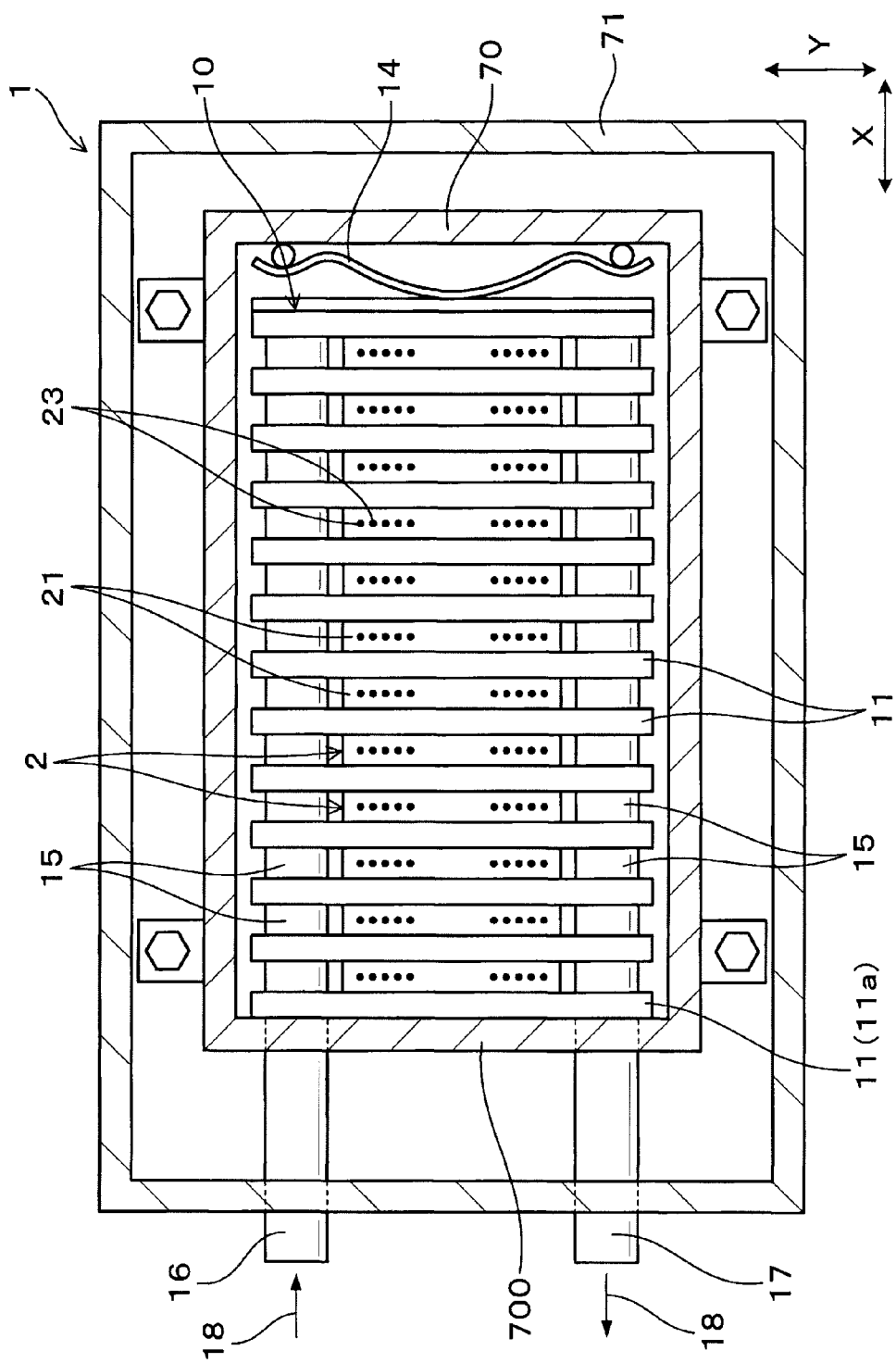
FIG. 3 is a sectional view taken along the line III-III of FIG. 1.

Meanwhile, as shown in FIG. 3, the laminated body 10 is constituted by laminating the plurality of semiconductor modules 2 and the plurality of cooling pipes 11 in the X direction as described above in the present embodiment.

Two cooling pipes 11 adjacent in the X direction are connected by connecting pipes 15 at both end portions in a width direction (Y direction) perpendicular to both the X direction and the Z direction.

Moreover, an inlet pipe 16 for introducing refrigerant 18 and an outlet pipe 17 for discharging the refrigerant 18 are attached to an end cooling pipe 11a positioned at one end in the X direction among the plurality of cooling pipes 11.

With the refrigerant 18 is introduced from the inlet pipe 16, the refrigerant 18 flows through all of the cooling pipes 11 through the connecting pipes 15, and is discharged from the outlet pipe 17.

Thereby, the present embodiment is configured to cool the semiconductor modules 2.

The laminated body 10 is fixed inside a frame 70.

A pressing member 14 (leaf spring) is disposed in a position adjacent to the laminated body 10 in the X direction.

The laminated body 10 is pressed toward a wall portion 700 of the frame 70 by the pressing member 14.

Thereby, while ensuring a contact pressure between the semiconductor modules 2 and the cooling pipes 11, the laminated body 10 is fixed in the frame 70.

The frame 70 is fixed to the case 71.

As shown in FIG. 2, each semiconductor module 2 includes a sealed portion 21 having the built-in semiconductor elements 20, and a plurality of power terminals 22 and control terminals 23 projecting from the sealed portion 21.

The power terminals 22 are a positive terminal 22p that is connected to the positive side DC bus bar 5p, a negative terminal 22n that is connected to the negative side DC bus bar 5n, and an AC terminal 22c for outputting the AC power.

An AC bus bar (not shown) is connected to the AC terminal 22c.

The AC terminal 22c and the three-phase AC motor 81 are electrically connected through the AC bus bar (refer to FIG. 8).

In addition, the control terminals 23 are connected to a control circuit board 12.

Switching operations of the semiconductor elements 20 are controlled by the control circuit board 12.

Thereby, this configuration converts the DC power supplied from the DC power source 8 (refer to FIG. 8) into the AC power.

Figure 5:
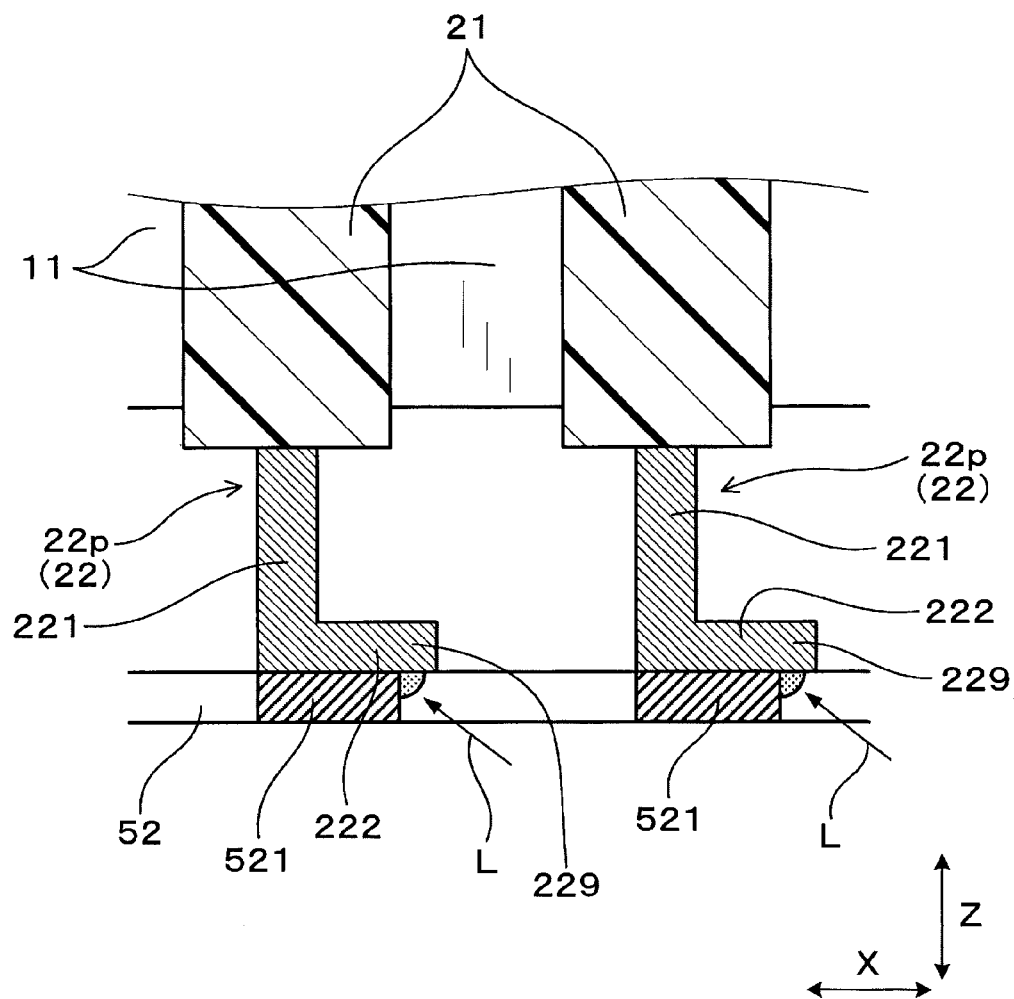
FIG. 5 is a sectional view taken along the V-V line of FIG. 2.

As shown in FIG. 5, a respective power terminal 22 includes a projecting portion 221 that projects in the Z direction from the sealed portion 21 of the semiconductor modules 2, and an extending portion 222 extending in the X direction from a distal end of the projecting portion 221.

Further, comb-shaped portions 521 (refer to FIG. 4) are formed in the above-mentioned bus bar standing portions 512 of the DC bus bars 5p, 5n.

As shown in FIG. 5, each comb-shaped portion 521 and the extending portion 222 of the power terminals 22 are overlapped.

A tip 229 of the extension portion 222 is not overlapped on the comb-shaped portion 521.

Laser beam L is irradiated to the tip 229 and the comb-shaped portions 521 to weld them.

Next, a method of manufacturing the electric power converter 1 will be described.

Figure 9:
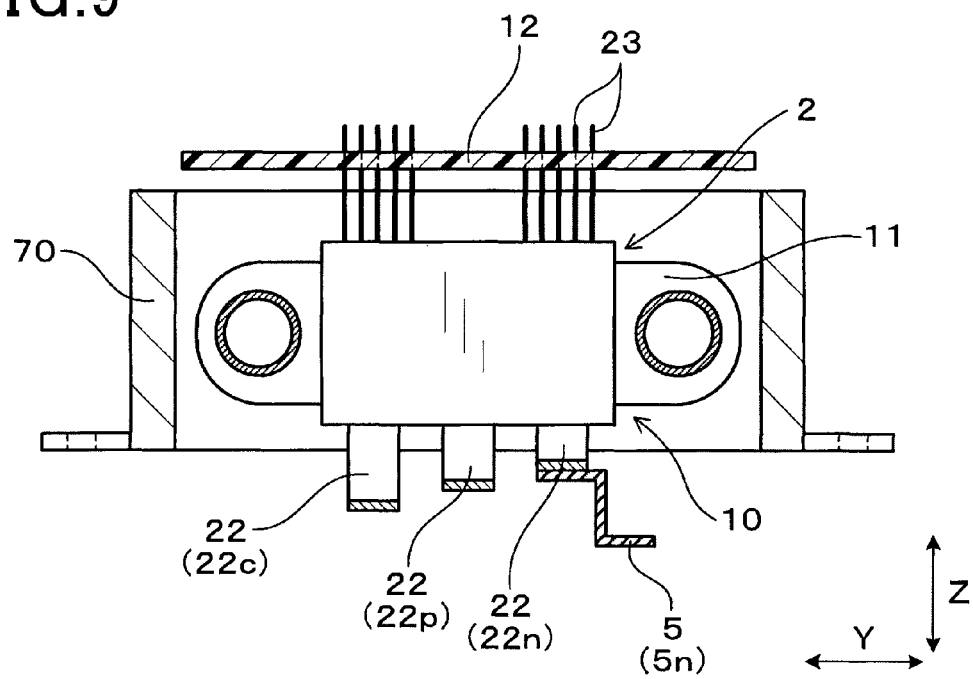
FIG. 9 shows a manufacturing step diagram of the electric power converter in the first embodiment.

In manufacturing the electric power converter 1, first, as shown in FIG. 9, the laminated body 10 is formed by laminating the semiconductor modules 2 and the cooling pipes 11, and the laminated body 10 is fixed inside the frame 70 by the pressing member 14 (refer to FIG. 3).

Then, the control circuit board 12 is connected to the control terminals 23 of the semiconductor modules 2.

Figure 10:
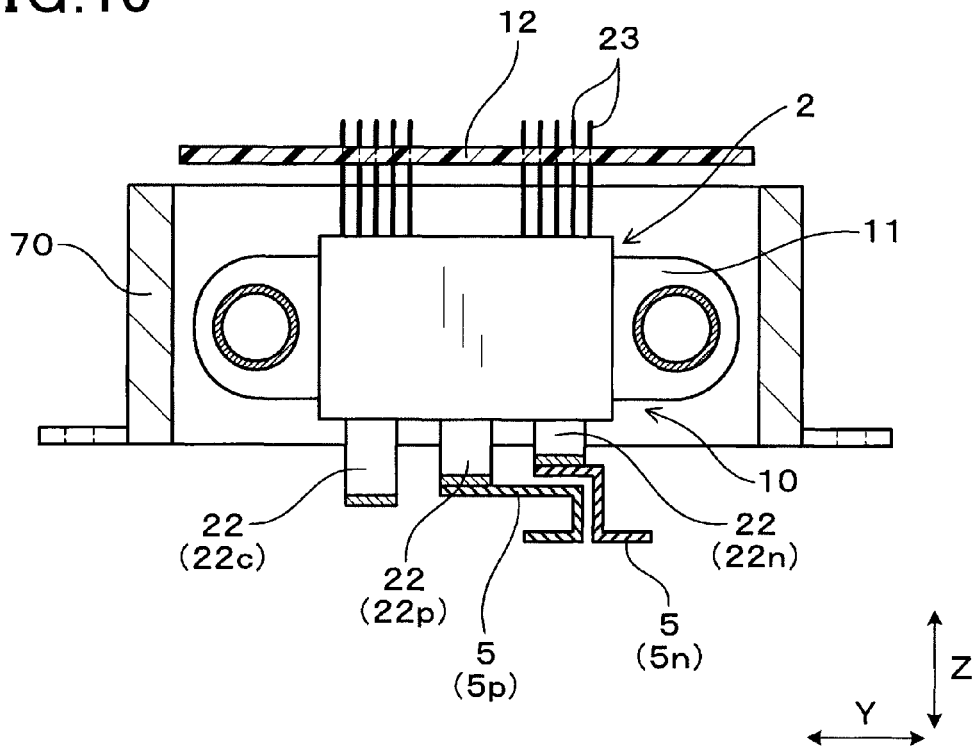
FIG. 10 shows a diagram subsequent to FIG. 9.

Next, as shown in FIG. 10, the negative side DC bus bar 5n is connect to the negative terminal 22n of the semiconductor module 2.

At this time, the laser beam L is irradiated to the comb-shaped portion 521 (refer to FIG. 5) of the negative side DC bus bar 5n and the extending portion 222 of the negative terminal 22n, and they are welded.

Figure 11:
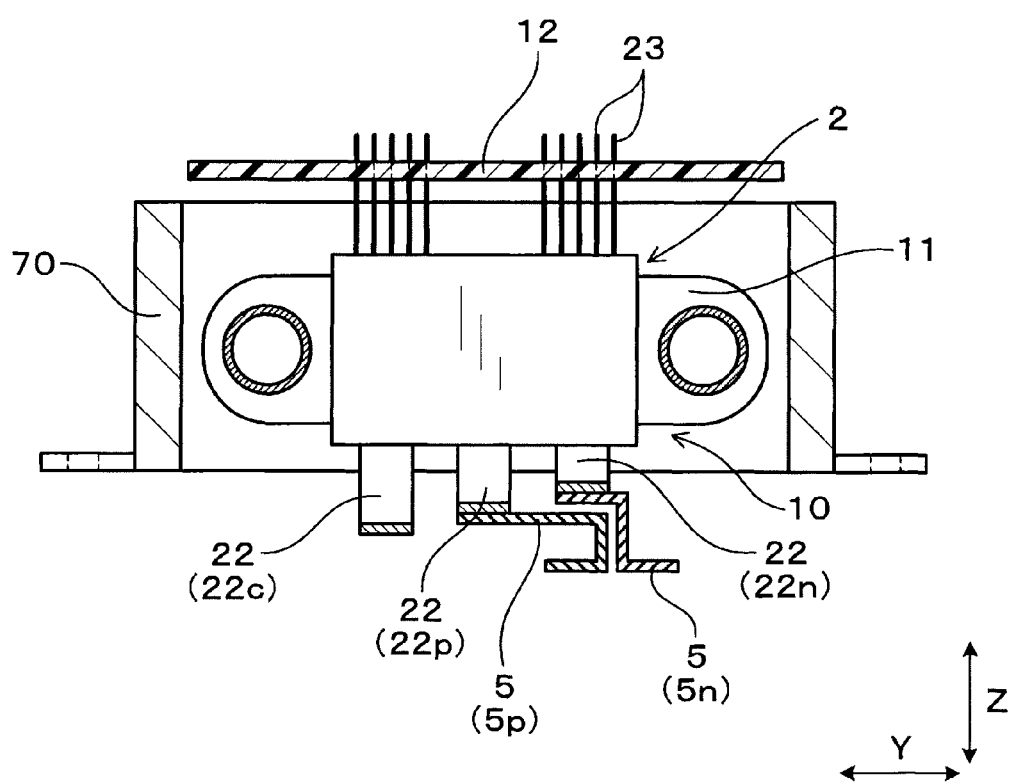
FIG. 11 shows a diagram subsequent to FIG. 10.

Then, as shown in FIG. 11, the positive side DC bus bar 5p is connected to the positive terminal 22p of the semiconductor modules 2.

At this time, the laser beam L is irradiated to the comb-shaped portion 521 (refer to FIG. 5) of the positive DC bus bar 5p and the extending portion 222 of the positive terminal 22p, and they are welded.

Figure 12:
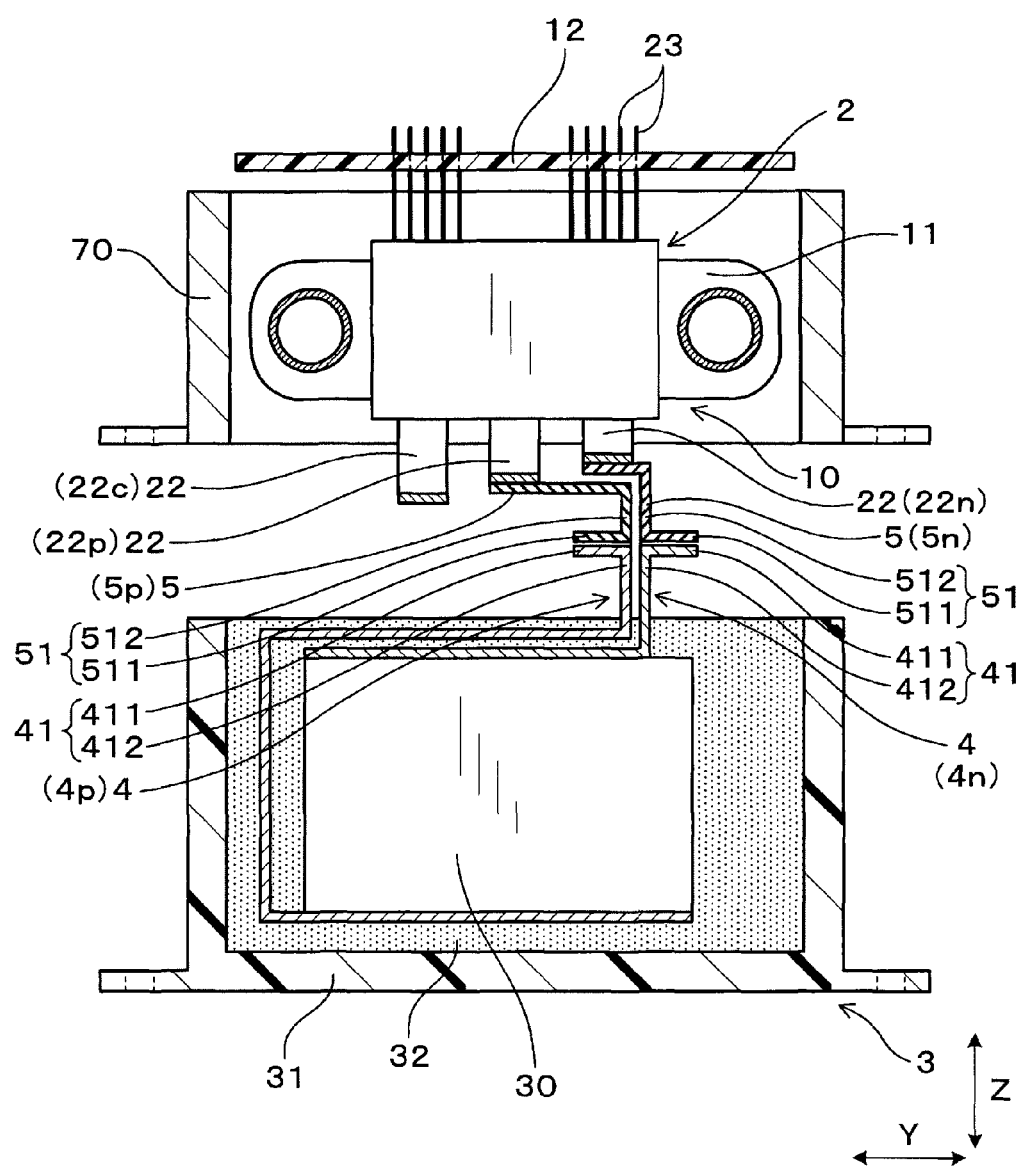
FIG. 12 shows a diagram subsequent to FIG. 11.

Subsequently, as shown in FIG. 12, the bus bar connecting portions 511 of the DC bus bars 5 and the terminal connecting portions 411 of the capacitor terminals 4 are overlapped with.

Then, the connecting portions 6a, 6b (refer to FIG. 1) are fastened.

At this time, the first connecting portion 6a is fastened by inserting the fastening member 13 into the through hole 33 from the bottom wall portion 311 side of the capacitor case 31.

Then, the laminated body 10 and the capacitor 3 are housed in the case 71.

Finally, the respective frame 70 and the capacitor 3 are fixed to the case 71.

By performing the above steps, the electric power converter 1 is manufactured.

Next, functions and effects of the present embodiment will be described.

As shown in FIG. 1, the DC bus bars 5 and the capacitor terminals 4 are connected at least by two connecting portions 6a, 6b in the present embodiment.

Each DC bus bar 5 has the bus bar main body portion 51 connected to the semiconductor module 2.

Two connecting portions 6a, 6b are connected by the parts of the bus bar main body portions 51.

In addition, the capacitor terminals 4 have terminal main body portions 41 that are connected to the capacitor elements 30.

Two connecting portions 6a, 6b are connected by the parts of the terminal main body portions 41.

Therefore, it is possible to further reduce the parasitic inductance on the DC bus bars 5 and the capacitor terminals 4.

That is, by adopting the above configuration, as shown in FIGS. 6 and 7, the current I flowing between the semiconductor modules 2 and the capacitor elements 30 can be divided into at least two current paths to flow the path passing through one of the connecting portions 6a and the other path passing through the other one of the connecting portions 6b among two connecting portions 6a, 6b.

Therefore, it is possible to increase the number of current paths.

Although the parasitic inductance occurs on the individual current path, since these inductances are connected in parallel with each other, a value of the total inductance obtained by combining a plurality of inductances is smaller than a value of each inductance.

Therefore, it is possible to reduce the inductance that parasitizes on the DC bus bars 5 and the capacitor terminals 4 (combined inductance), and when the semiconductor elements 20 are turned on and off, it is possible to prevent the large surge caused by the inductance from occurring.

Figure 13:
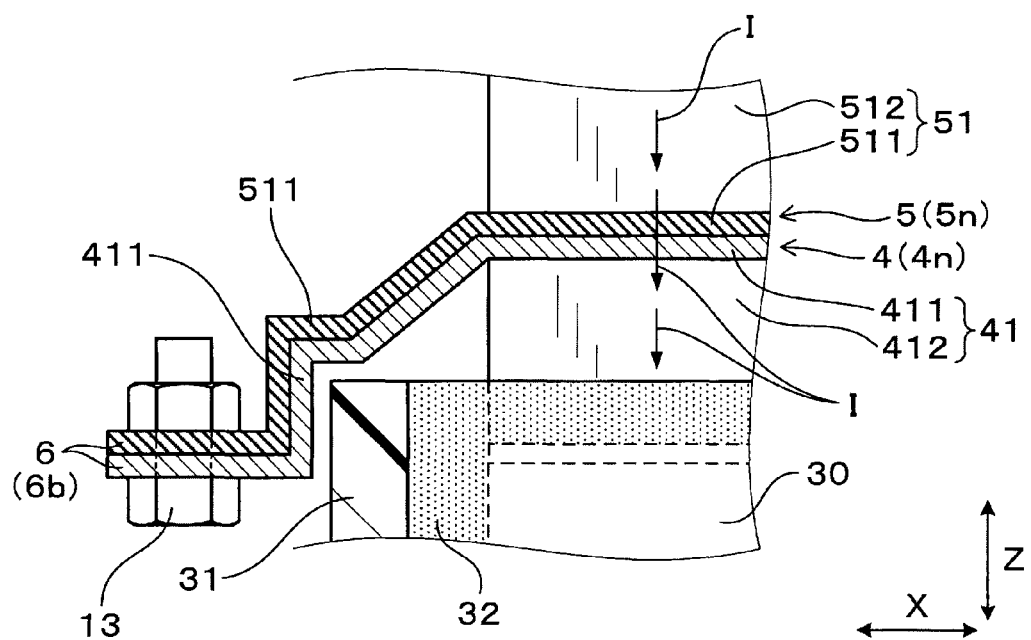
FIG. 13 shows an enlarged sectional view of the electric power converter in a state where a bus bar connecting portion and a terminal connecting portion are in contact in first embodiment.

In addition, as shown in FIG. 13, when the bus bar main body portion 51 and the terminal main body portion 41 are in contact, the current I flows directly between the bus bar main body portion 51 and the terminal main body portion 41 without passing through connecting portions 6a, 6b.

Therefore, the length of the current path is shortened.

Thus, in this case also, it can reduce the inductance that parasitizes on the DC bus bars 5 and the capacitor terminals 4.

Further, as shown in FIG. 1, the bus bar connecting portion 511 and the terminal connecting portion 411 are overlapped with each other in the present embodiment.

Therefore, as shown in FIG. 6 and FIG. 7, the bus bar connecting portions 511 and the terminal connecting portions 411 can be brought close to each other.

The direction of the current I flowing through the bus bar connecting portion 511 and the direction of the current I flowing through the terminal connecting portion 411 are opposite to each other.

Therefore, by bringing the bus bar connecting portions 511 and the terminal connecting portions 411 close to each other, it is possible to cancel a magnetic field generated by the current I flowing through the bus bar connecting portions 511 and a magnetic field generated by the current I flowing through the terminal connecting portion 411 each other.

Therefore, it is possible to reduce a mutual inductance that occurs between the bus bar connecting portions 511 and the terminal connecting portions 411.

In addition, as shown in FIG. 1, the through hole 33 penetrating in the Z direction is formed in the capacitor 3 in the present embodiment.

One of the connection portions 6 (the first connecting portion 6a) of the two connecting portions 6 (6a, 6b) is disposed at a position overlapping the through hole 33 in the Z direction.

Then, the first connecting portion 6a is fastened by inserting the fastening member 13 in the through hole 33 from a side opposite to a side where the first connecting portion 6a is disposed.

Therefore, it is possible to dispose the first connecting portion 6a inside of an outer periphery of the capacitor 3 when viewed from the Z direction.

Thus, it is possible to shorten the length in the X direction of the terminal connecting portion 411 and the bus bar connecting portion 511, and the DC bus bars 5 and the capacitor terminals 4 can be lightened.

Moreover, since the first connecting portion 6a is fastened by inserting the fastening member 13 into the through hole 33 in the present embodiment, the frame 70, the pressing member 14 or the like is not interfering during a fastening operation, and the fastening operation can be carried out smoothly.

Further, as described above, it is possible to increase a surface area of the sealing member 32 by forming the through hole 33 in the capacitor case 31.

Therefore, it is possible to enhance the cooling efficiency of the capacitor elements 30.

Moreover, as shown in FIG. 2, the pair of DC bus bars 5p, 5n are disposed in adjacent, and the bus bar standing portions 512p, 512n of the DC bus bars 5p, 5n are disposed close to each other with a predetermined distance therebetween in the present embodiment.

Therefore, it is possible to reduce a mutual inductance that parasitizes between the bus bar standing portion 512p of the positive side DC bus bars 5p and the bus bar standing portion 512n of the negative side DC bus bars 5n.

Thus, a surge generated when switch-operating the semiconductor elements 20 can be further reduced.

Moreover, as shown in FIG. 1, the second connecting portion 6b is formed at a position not overlapping with the capacitor 3 when viewed from the Z direction in the present embodiment.

Therefore, the capacitor 3 is not interfering during fastening the second connecting portion 6b, and the fastening operation can be carried out smoothly.

In addition, as shown in FIG. 1 and FIG. 2, the DC bus bars 5 of the present embodiment include the bus bar standing portions 512.

The bus bar standing portions 512 are standing in the Z direction from the bus bar connecting portions 511.

Accordingly, the semiconductor modules 2 connected to the bus bar standing portions 512 can be disposed in positions away from the connecting portions 6a, 6b.

Therefore, the semiconductor modules 2 or the like are not interfering during connecting the connecting portions 6a, a 6b, and the connecting operation can be carried out easily.

Further, the power terminals 22 of the semiconductor modules 2 and the DC bus bars 5 are welded by using the laser beam L in the present embodiment.

Conventionally, since the power terminals 22 and the DC bus bars 5 were welded by TIG welding, a large heat was easy to occur during welding.

Therefore, when the power terminals 22 are shortened, the heat generated by welding may be transmitted to the semiconductor element 20 through the power terminals 22, and there is a possibility that the characteristics of the semiconductor elements 20 is likely to change.

Therefore, it is inevitable to form the power terminals 22 long, and a large inductance is easy to parasitize on the power terminals 22.

However, since the DC bus bars 5 and the power terminals 22 are welded by laser welding in the present embodiment, thus it is possible to suppress such a problem from occurring.

That is, since the laser welding is possible to concentrate a high energy within a narrow range, excess heat is less likely to occur.

Therefore, even when the length of the power terminals 22 are shortened, the characteristics of the semiconductor elements 20 can be prevented from changing due to the large heat transmitted to the semiconductor elements 20 through the power terminals 22.

Thus, it is possible to shorten the power terminals 22, and it is possible to reduce the inductance that parasitizes on the power terminals 22.

As a result, it is possible to further reduce the surge applied to the semiconductor elements 20.

As described above, according to the present embodiment, it is possible to provide the electric power converter that can further reduce the inductance that parasitizes on the DC bus bars and the capacitor terminals.

It should be noted that, as shown in FIG. 1, although the connecting portions 6 are connected by using the fastening member 13 in the present embodiment, the present disclosure is not limited thereto, and it is also possible to weld the connecting portions 6.

Moreover, although two connecting portions 6 of the first connecting portion 6a and the second connecting portion 6b are formed in the present embodiment, the present disclosure is not limited thereto.

In other words, it is also possible to form other connecting portions 6 by extending the bus bar connecting portion 511 and the terminal connecting portions 411 in the Y direction, and connecting them.

Thereby, it is possible to form three or more connecting portions 6.

Further, although the connecting portions 6 are fastened in the Z direction in the present embodiment, the present disclosure is not limited thereto.

That is, it may be configured to bend the connecting portions 6 and fasten them in the Y direction or X direction.

Further, although the DC bus bars 5 of the present embodiment include the bus bar connecting portions 511 and the bus bar standing portions 512, the present disclosure is not limited thereto.

That is, the semiconductor modules 2 may be directly connected to the bus bar connecting portions 511 without forming the bus bar standing portions 512.

In other words, it is also possible to connect two connecting portions 6a, 6b at all positions of the bus bar main body portions 51.

Similarly, although the capacitor terminals 4 of the present embodiment include the terminal connecting portions 411 and the terminal standing portions 412, the present disclosure is not limited thereto.

That is, the capacitor elements 30 may be directly connected to the terminal connecting portions 411 without forming the terminal standing portions 412.

In other words, it is also possible to connect two connecting portions 6a, 6b at all positions of the terminal main body portions 41.

Second Embodiment

In the following embodiments, among the reference numerals used in the drawings, ones having the same reference numerals as used in the first embodiment represent the same constituent elements as the first embodiment unless otherwise indicated.

The present embodiment is an example of changing a shape of the capacitor terminal 4.

Figure 14:
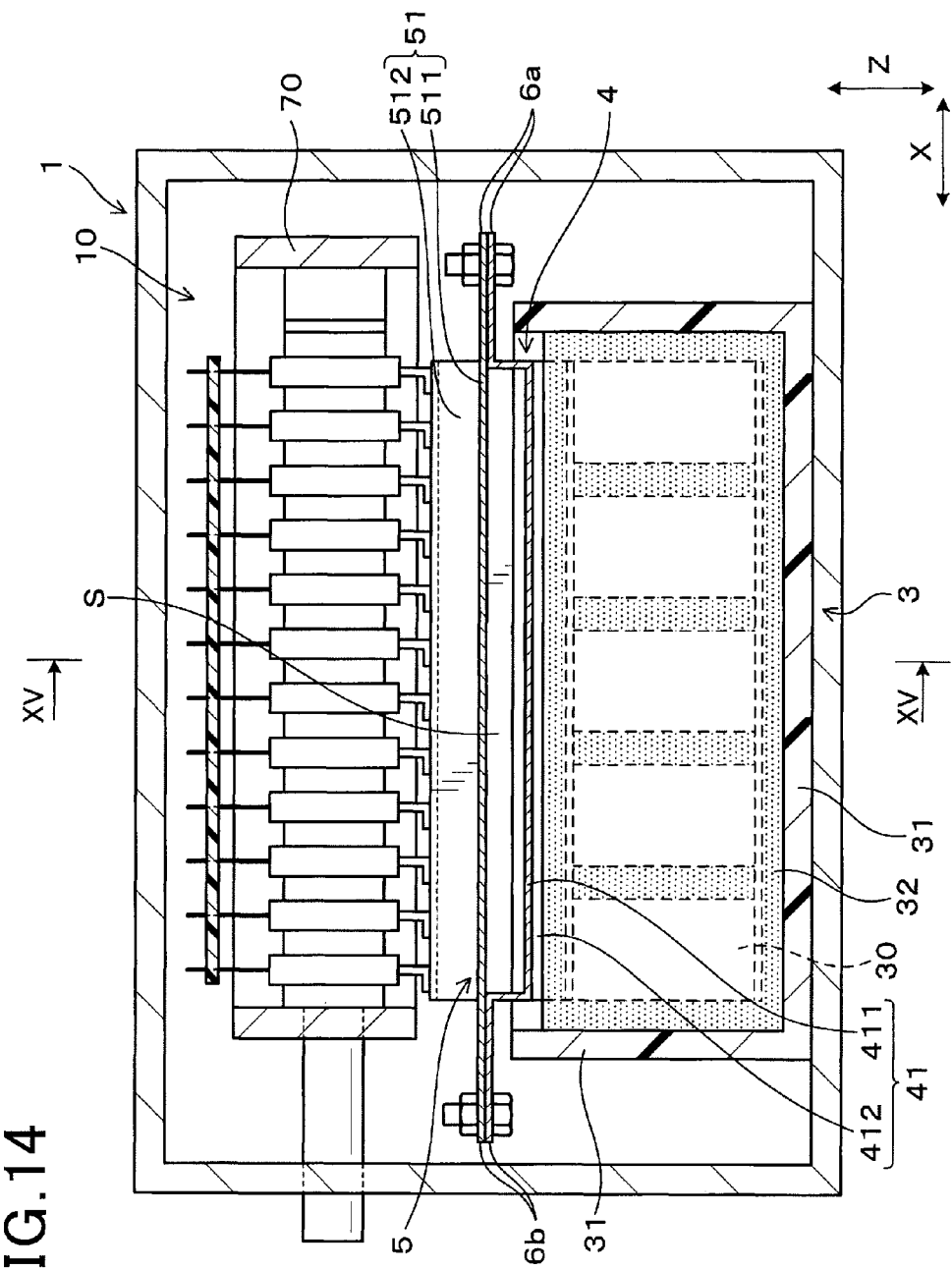
FIG. 14 is a sectional view of an electric power converter, and is a sectional view taken along the line XIV-XIV of FIG. 15 in a second embodiment.
Figure 15:
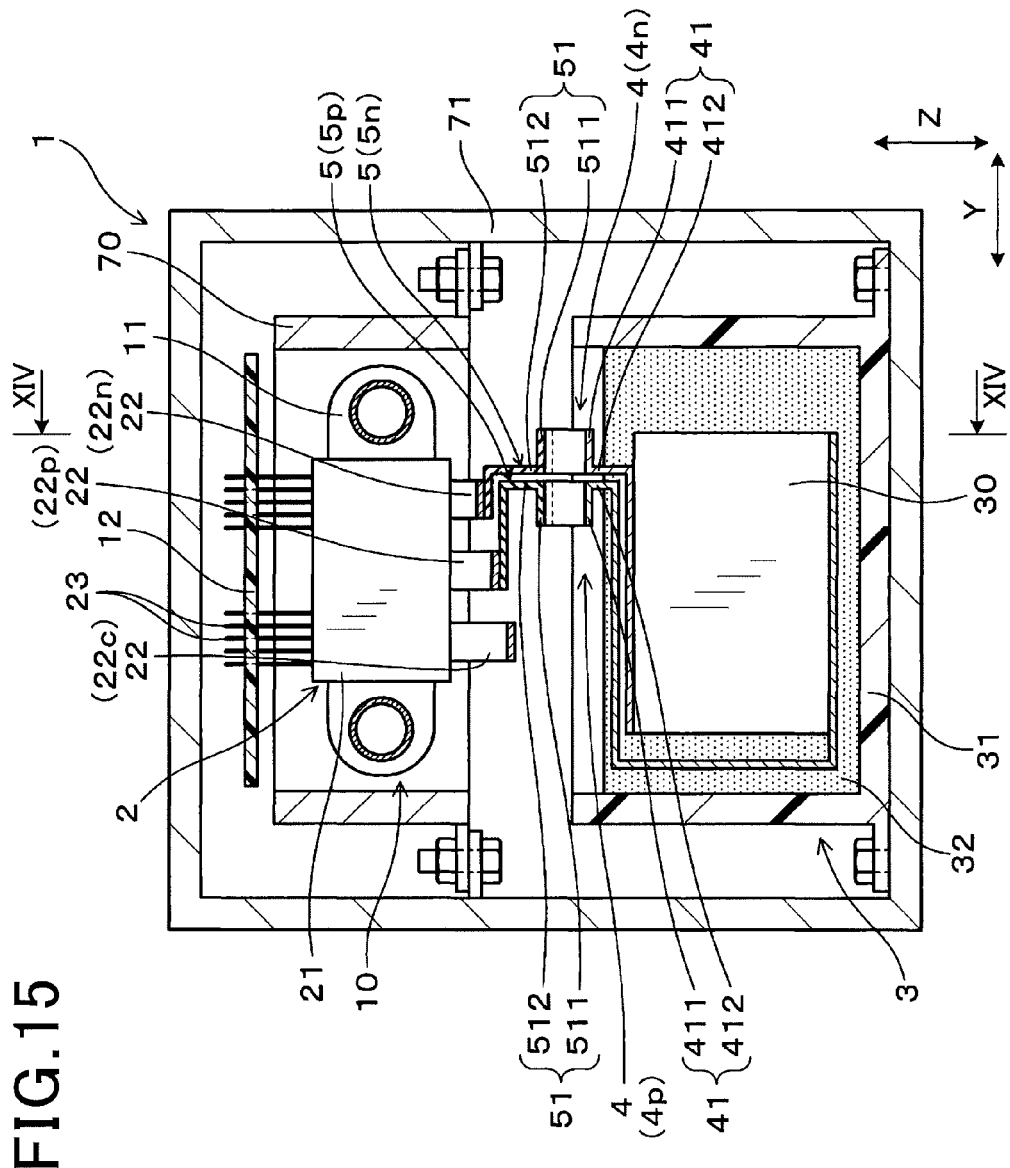
FIG. 15 is a sectional view taken along the line XV-XV of FIG. 14.

As shown in FIG. 14 and FIG. 15, the terminal connecting portions 411 are disposed inside the capacitor case 31 in the present embodiment.

The terminal connecting portions 411 are not sealed with the sealing member 32.

In addition, the bus bar connecting portions 511 are disposed outside the capacitor case 31.

Functions and effects of the present embodiment will be described.

In the present embodiment, the terminal connecting portions 411 are disposed in the capacitor case 31.

Therefore, it is possible to shorten the lengths of the terminal standing portions 412 in the Z direction, and the capacitor terminals 4 can be lightened.

Further, the bus bar connecting portions 511 are disposed outside the capacitor case 31 in the present embodiment.

Therefore, it is possible to form a relatively large space S between the bus bar connecting portions 511 and the terminal connecting portions 411.

When the electric power converter 1 starts operating, the semiconductor modules 2 generate heat, and this heat is transmitted to the DC bus bars 5.

Therefore, the temperature of the bus bar connecting portions 511 increases.

However, if the large space S is formed between the bus bar connecting portions 511 and the terminal connecting portions 411 as in the present embodiment, the heat of the bus bar connecting portions 511 is hardly transmitted to the terminal connecting portions 411.

Therefore, it is possible to suppress the temperature of the capacitor elements 30 from rising.

The remainder has the same structure, functions and effects as in the first embodiment.

Third Embodiment

The present embodiment is an example of changing a shape of the capacitor terminal 4.

Figure 16:
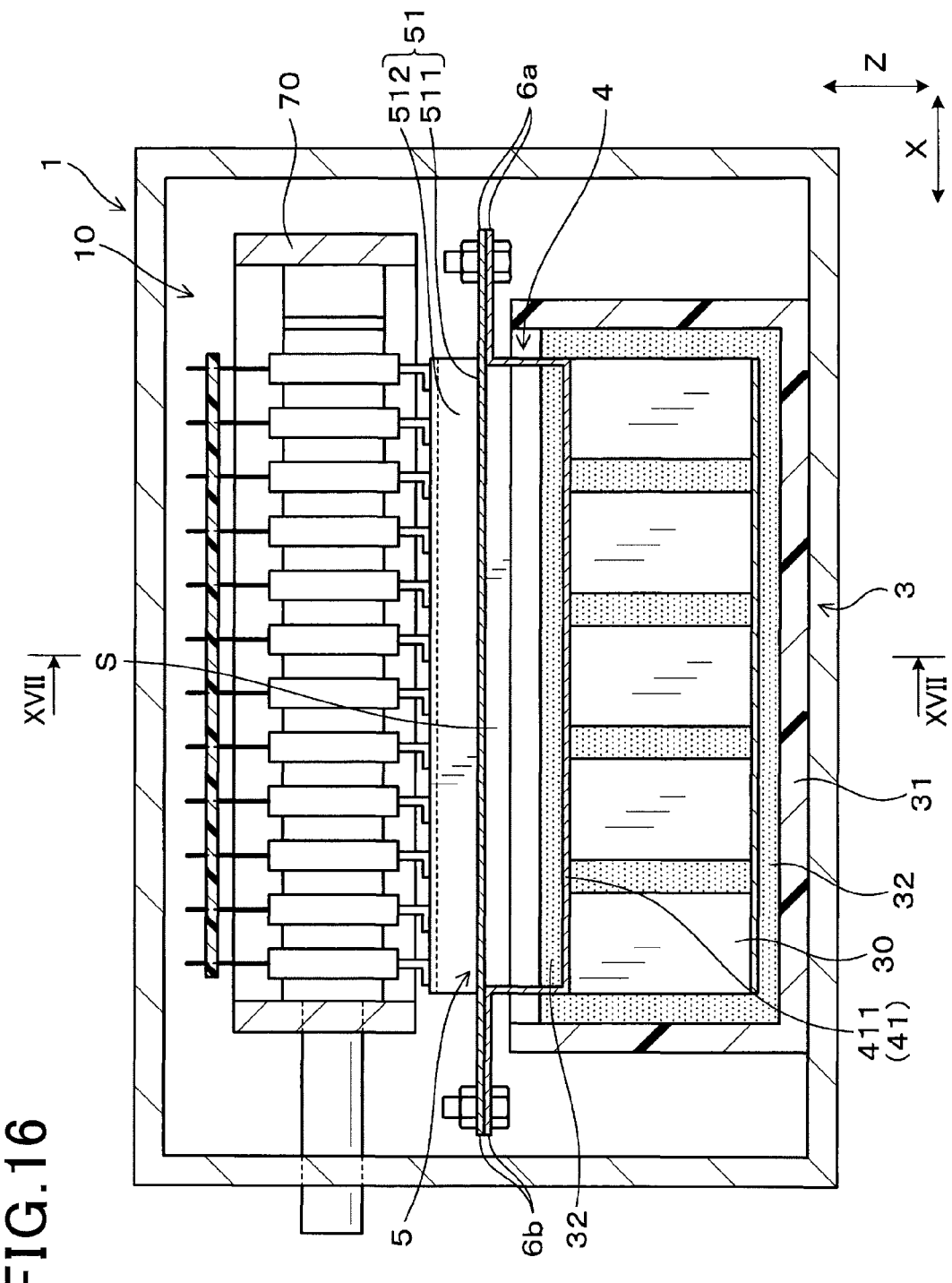
FIG. 16 is a sectional view of an electric power converter, and is a sectional view taken along the line XVI-XVI of FIG. 17 in a third embodiment.
Figure 17:
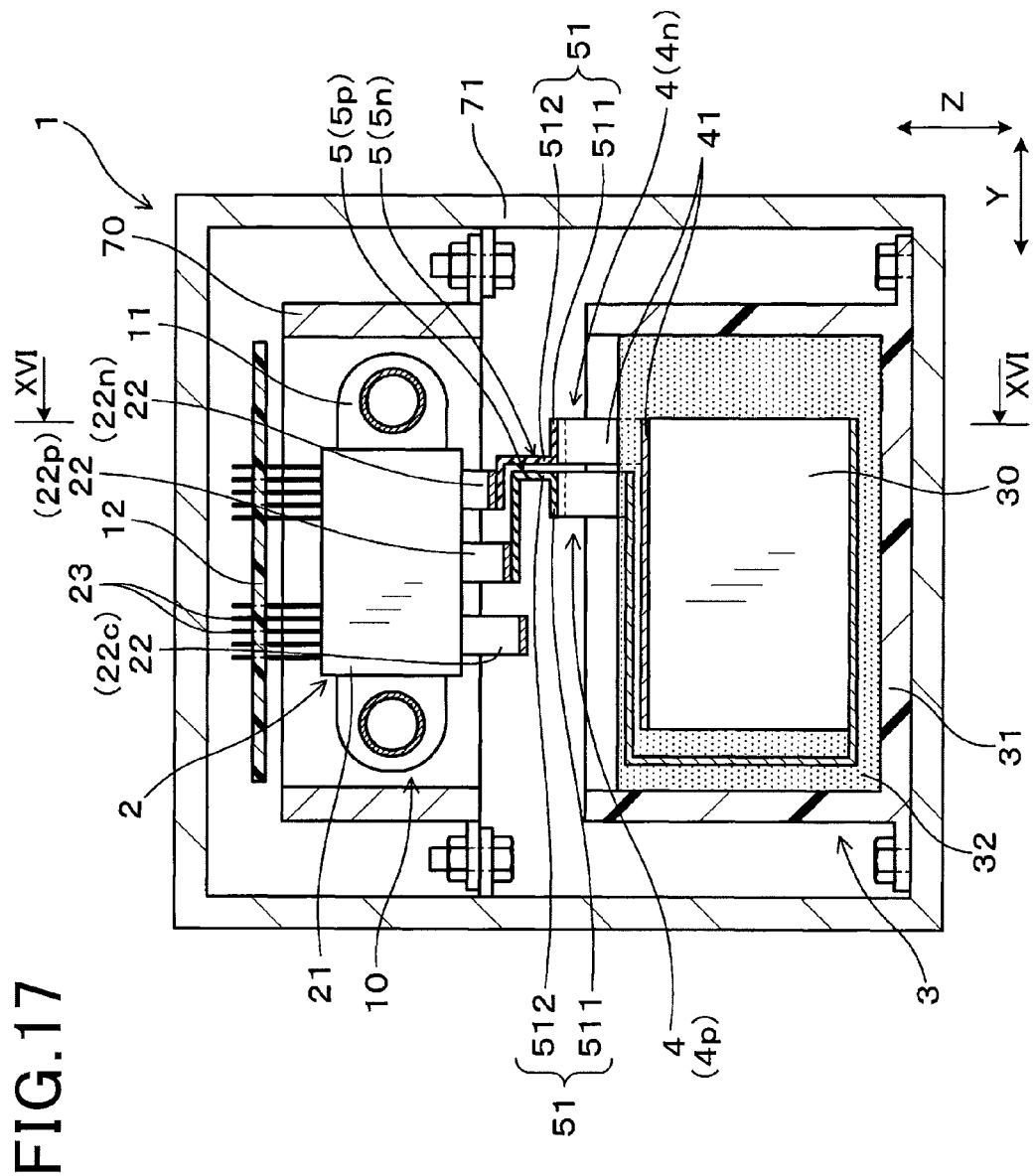
FIG. 17 is a sectional view taken along XVI-XVII line of FIG. 16.

As shown in FIG. 16 and FIG. 17, similarly to the second embodiment, the terminal connecting portions 411 are housed inside the capacitor case 31 in the present embodiment.

The terminal connecting portions 411 are sealed with the sealing member 32.

There exists a part of the sealing member 32 between the terminal connecting portions 411 and the bus bar connecting portions 511.

In addition, the bus bar connecting portions 511 are disposed outside the capacitor case 31.

Functions and effects of the present embodiment will be described.

The part of the sealing member 32 exists between the terminal connecting portions 411 and the bus bar connecting portions 511 in the present embodiment.

As described above, when the electric power converter 1 starts operating, the semiconductor modules 2 generate heat, and this heat is transmitted to the DC bus bars 5 causing the temperature of the bus bar connecting portions 511 to increase.

By providing the part of the sealing member 32 between the terminal connecting portions 411 and the bus bar connecting portions 511 as in the present embodiment, the heat radiated from the bus bar connecting portions 511 can be blocked by the sealing member 32.

Therefore, the heat is hardly transmitted to the terminal connecting portions 411 from the bus bar connecting portions 511, and it can effectively suppress the temperature of the capacitor elements 30 from rising.

Further, the bus bar connecting portions 511 are disposed outside the capacitor case 31 in the present embodiment.

Therefore, it is possible to form a large space S between the bus bar connecting portions 511 and the sealing member 32.

As a result, the heat from the bus bar connecting portions 511 to the terminal connecting portions 411 can be effectively suppressed from being transmitted by the space S.

The remainder has the same structure, functions and effects as in the first embodiment.

Fourth Embodiment

The present embodiment is an example for changing a position of the capacitor 3.

Figure 18:
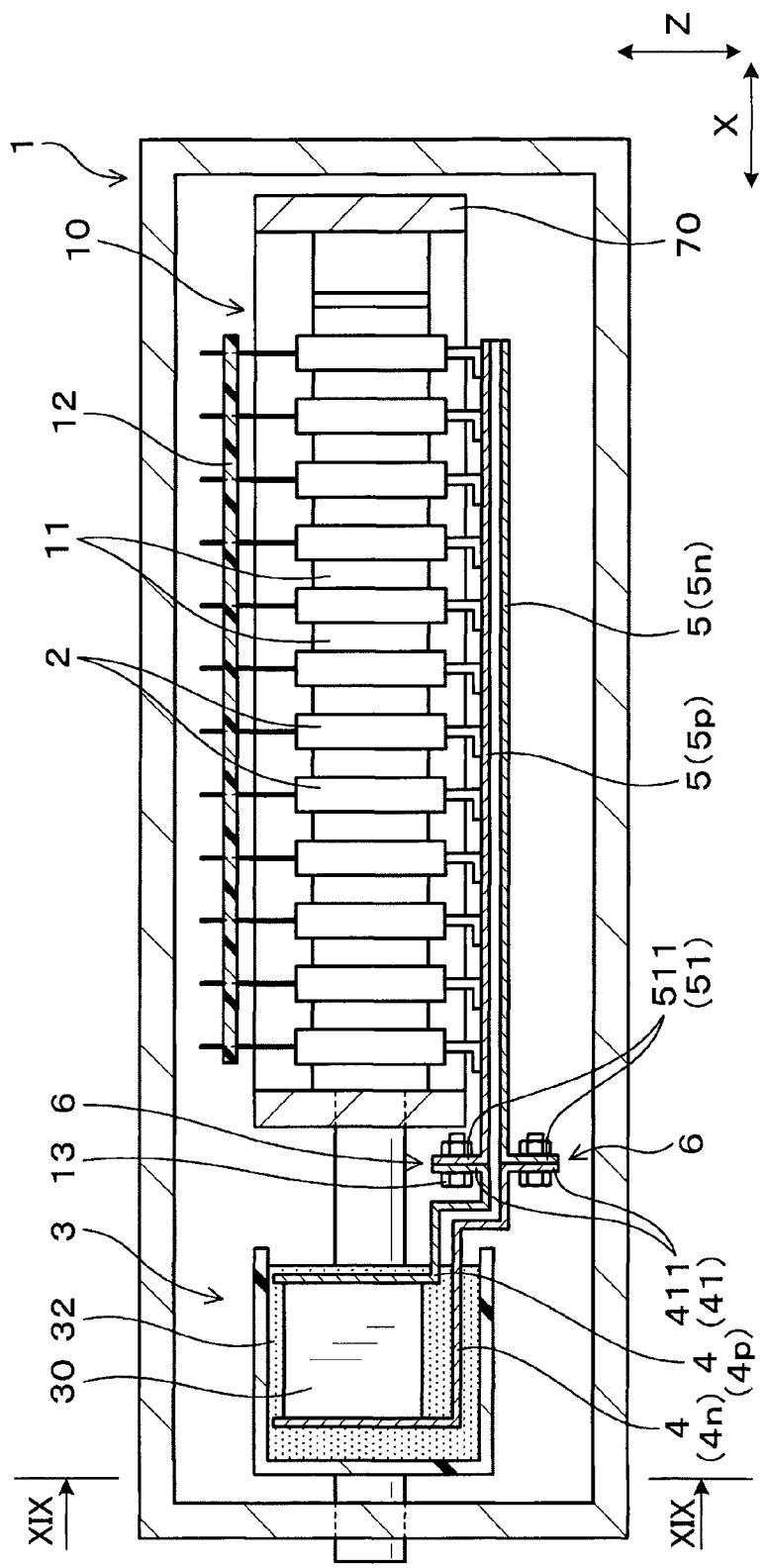
FIG. 18 is a sectional view of an electric power converter, and is a sectional view taken along the line XVIII-XVIII of FIG. 19 in a fourth embodiment.
Figure 19:
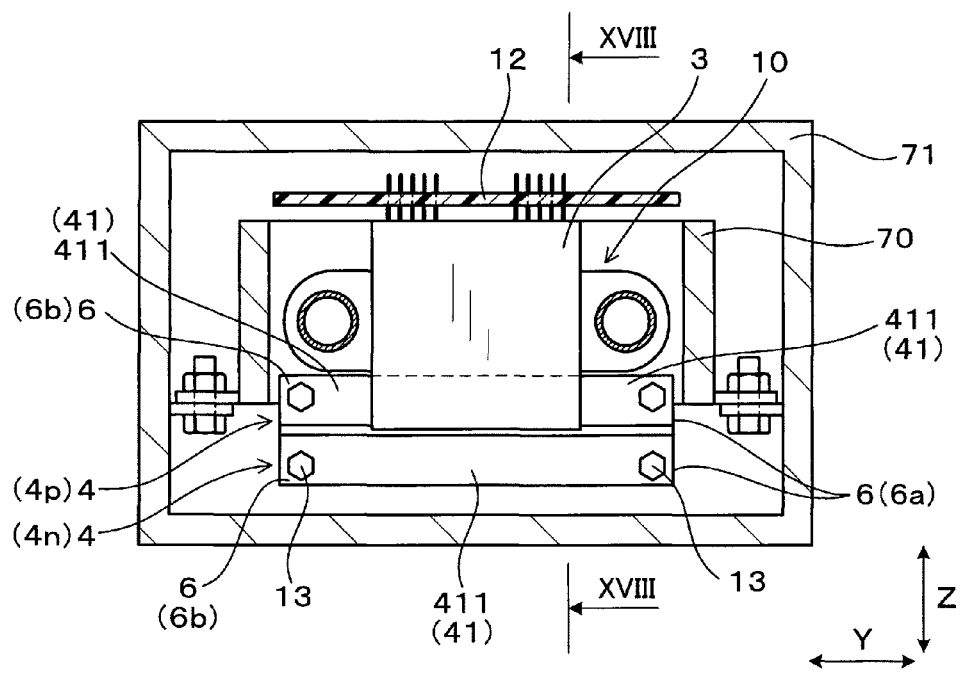
FIG. 19 is a sectional view taken along the line XIX-XIX of FIG. 18.

As shown in FIG. 18 and FIG. 19, the capacitor 3 is disposed at a position adjacent with respect to the laminated body 10 in the X direction in the present embodiment.

The respective terminal connecting portions 411 of the capacitor terminals 4 and the bus bar connecting portions 511 of the DC bus bars 5 have slender elongated shapes in the Y direction.

The two connecting portions 6a, 6b are formed at a position sandwiched in the Y direction by the terminal connecting portions 411 and the bus bar connecting portions 511.

Further, the connecting portions 6 are fastened in the X direction by using the fastening member 13 in the present embodiment.

The remainder has the same structure, functions and effects as in the first embodiment.

Fifth Embodiment

The present embodiment is an example for changing a position of the capacitor 3.

Figure 20:
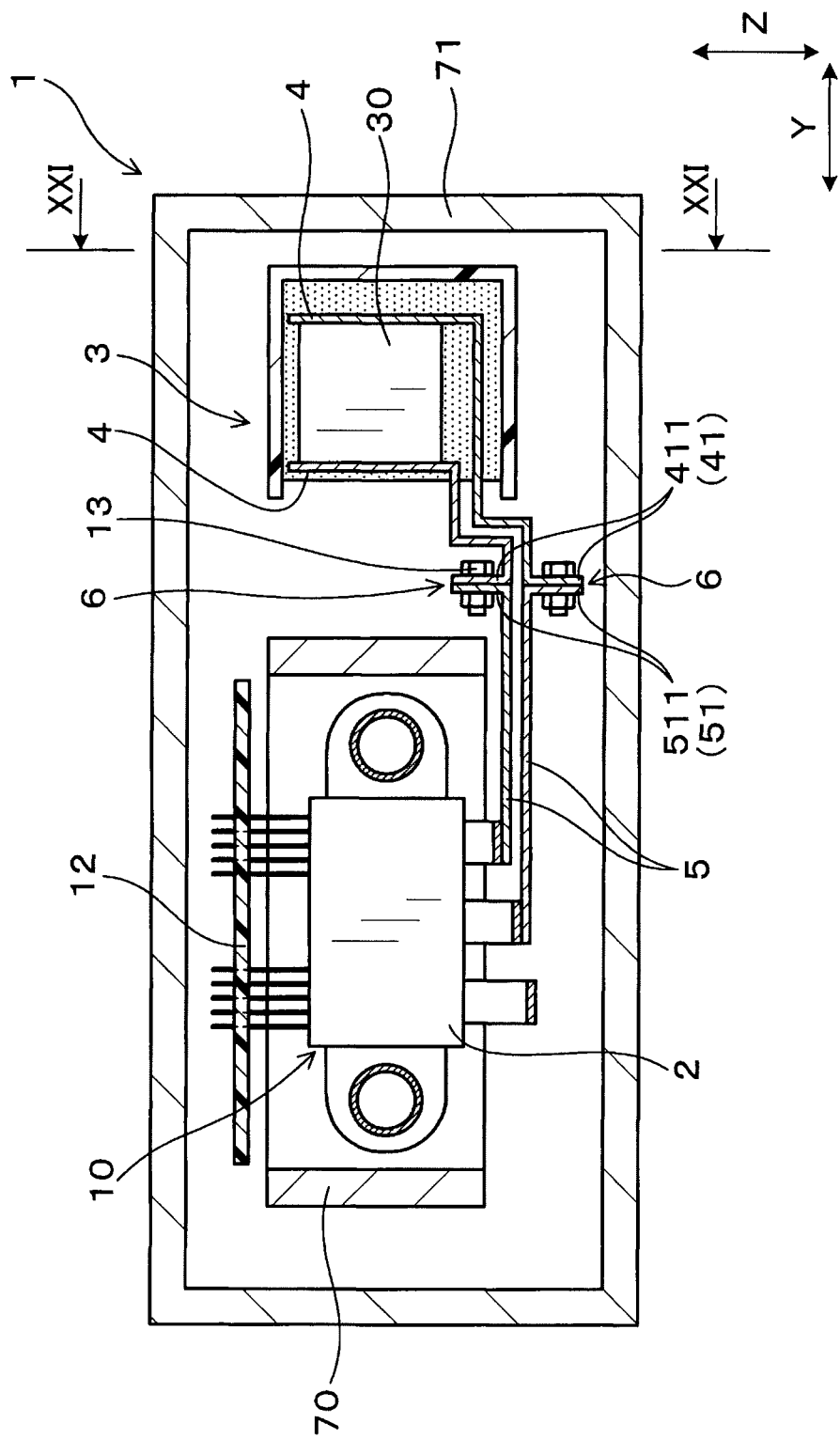
FIG. 20 is a sectional view of an electric power converter, and is a sectional view taken along the line XX-XX of FIG. 21 in a fifth embodiment.
Figure 21:
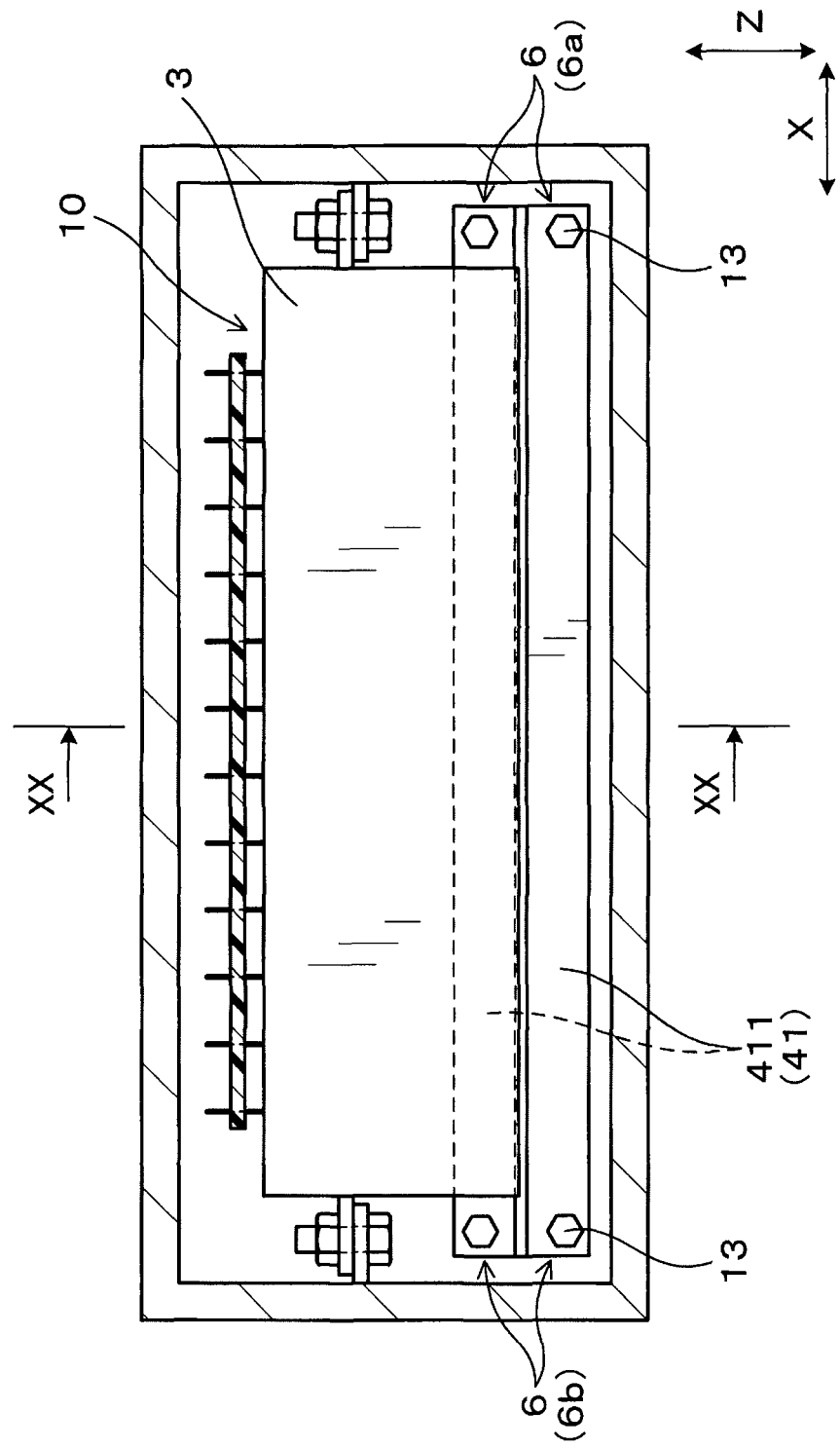
FIG. 21 is a sectional view taken along the line XXI-XXI of FIG. 20.

As shown in FIG. 20 and FIG. 21, the capacitor 3 is disposed at a position adjacent with respect to the laminated body 10 in the Y direction in the present embodiment.

The respective terminal connecting portions 411 of the capacitor terminals 4 and the bus bar connecting portions 511 of the DC bus bars 5 have slender elongated shapes in the X direction.

The two connecting portions 6a, 6b are formed at a position sandwiched in the X direction by the terminal connecting portions 411 and the bus bar connecting portions 511.

Further, the connecting portions 6 are fastened in the Y direction by using the fastening member 13 in the present embodiment.

The remainder has the same structure, functions and effects as in the first embodiment.

Sixth Embodiment

The present embodiment is an example of changing a shape of the DC bus bar 5.

Figure 22:
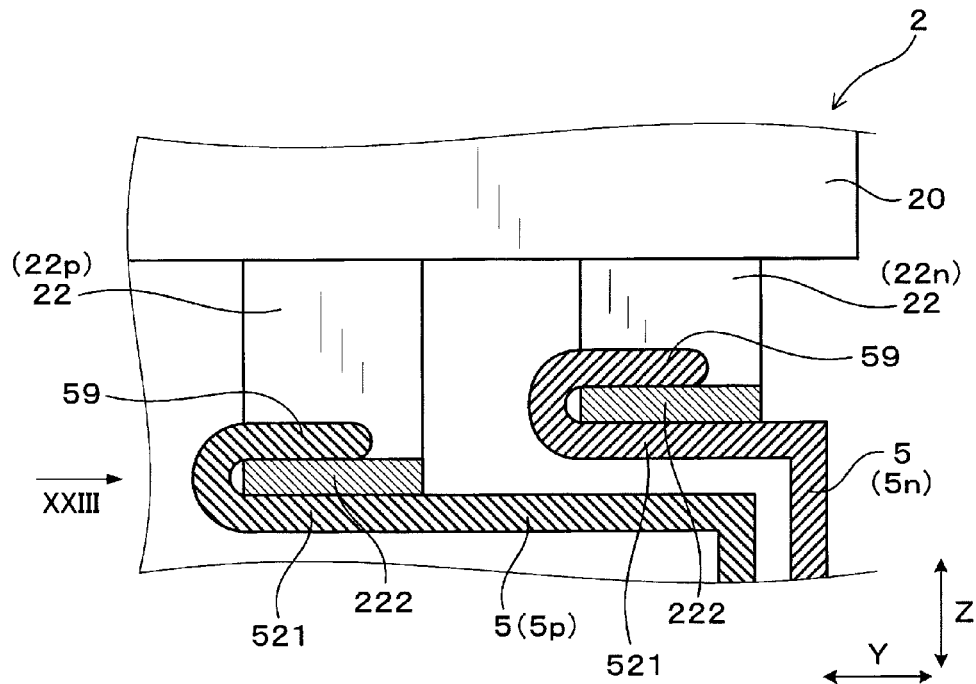
FIG. 22 shows an enlarged sectional view of a principal part of the electric power converter in a sixth embodiment.
Figure 23:
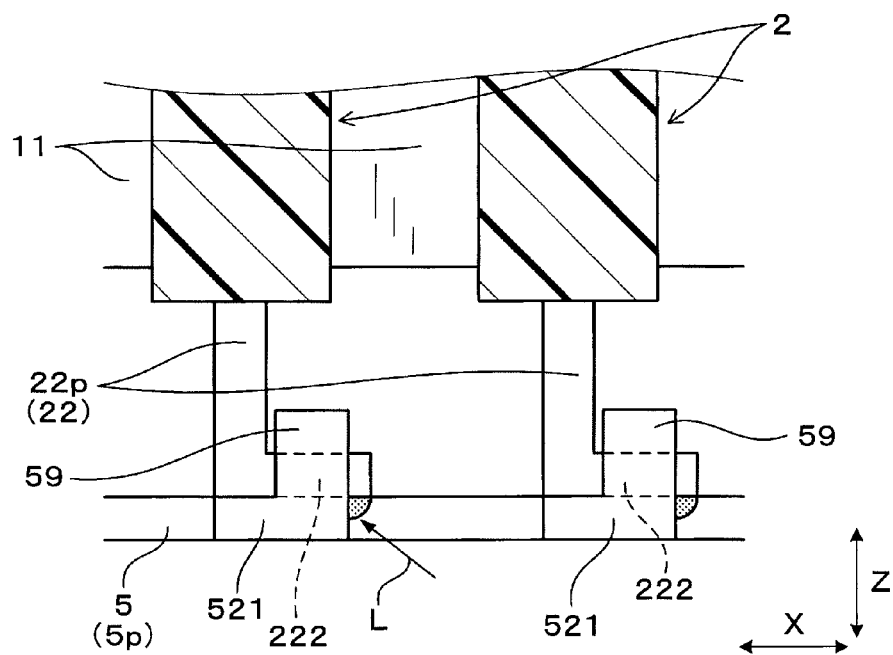
FIG. 23 shows a diagram viewed along an arrow line XXIII of FIG. 22.

As shown in FIG. 22 and FIG. 23, clip portions 59 are formed in the comb-shaped portions 521 of the DC bus bars 5 in the present embodiment.

The extending portions 222 of the power terminals 22 are sandwiched by the clip portions 59 in the Z direction.

Accordingly, when welding the extending portions 222 and the comb-shaped portions 521, these are prevented from being apart in the Z direction.

Therefore, a gap is hardly formed between the extending portions 222 and the comb-shaped portions 521, and it is possible to weld them easily.

The remainder has the same structure, functions and effects as in the first embodiment.

Seventh Embodiment

The present embodiment is an example for changing a forming position of the first connecting portion 6a.

Figure 24:
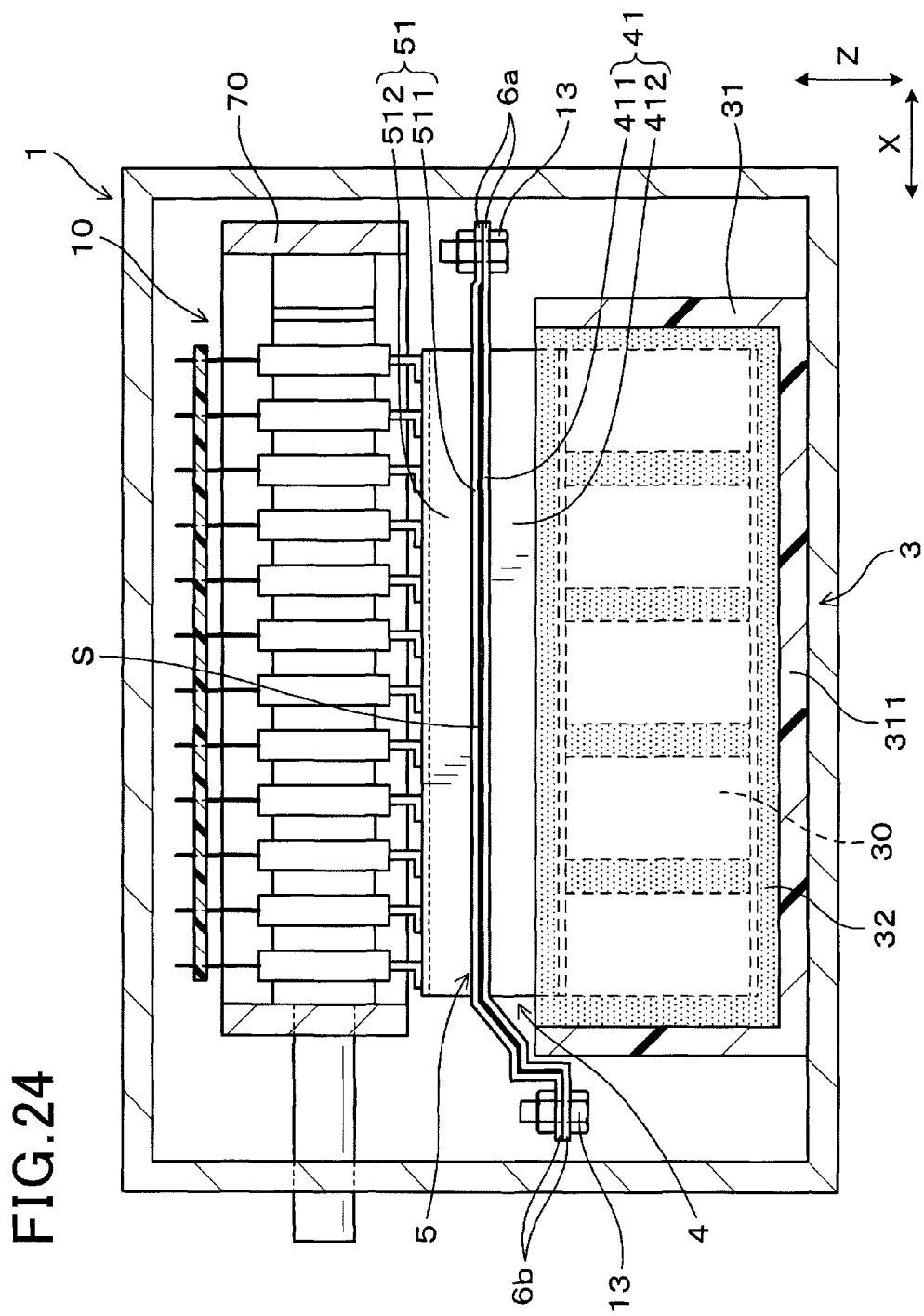
FIG. 24 shows a sectional view of an electric power converter in a seventh embodiment.

As shown in FIG. 24, the first connecting portion 6a is formed at a position not overlapping with the capacitor 3 when viewed from the Z direction in the present embodiment.

Therefore, the first connecting portion 6a can be easily connected even without forming the through hole 33 to the capacitor 3.

Therefore, it is possible to simplify a structure of the capacitor 3.

The remainder has the same structure, functions and effects as in the first embodiment.

Eighth Embodiment

The present embodiment is an example of changing a shape of the capacitor 3, and a forming position of the second connecting portion 6b.

Figure 25:
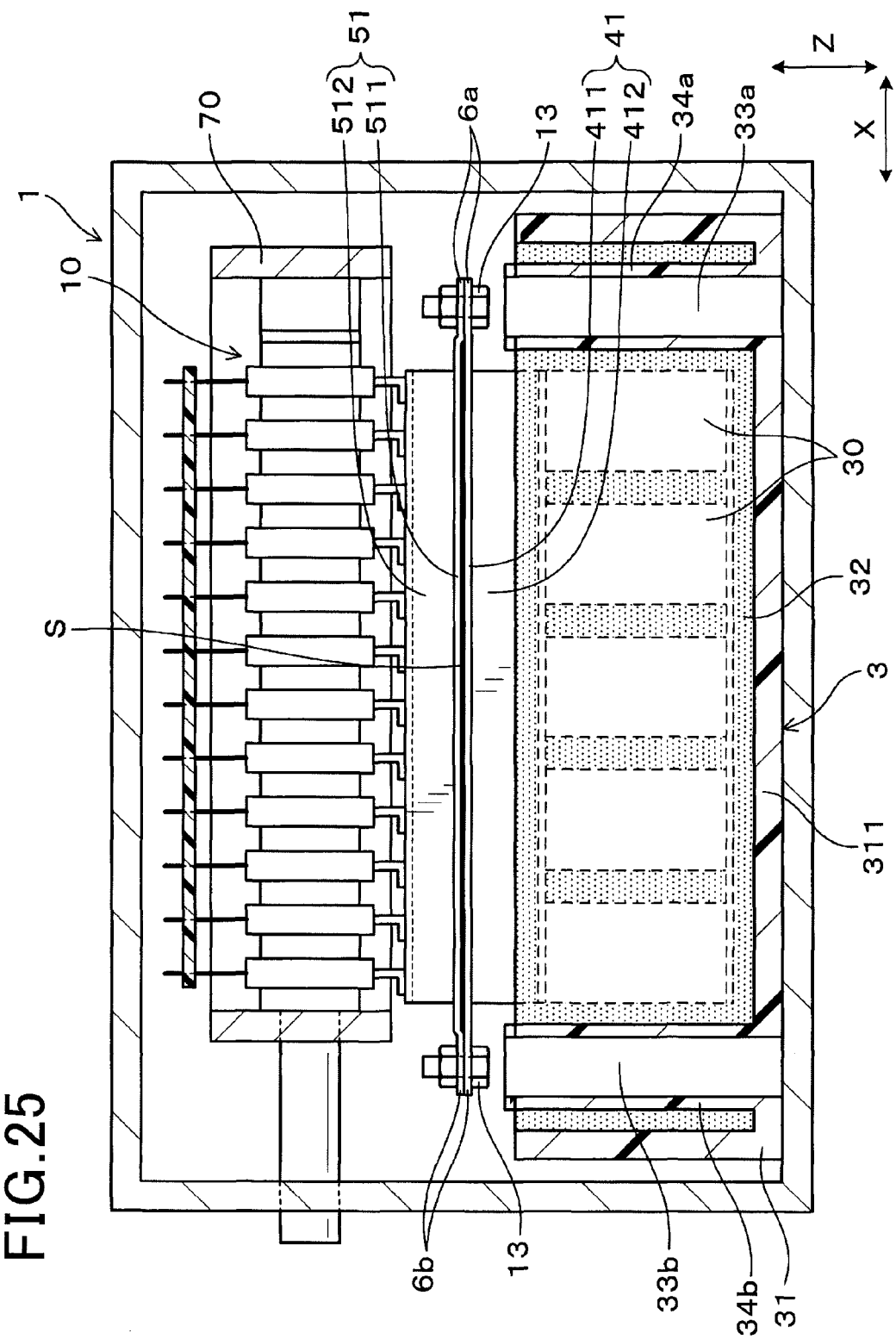
FIG. 25 shows a sectional view of an electric power converter in an eighth embodiment.

Are as shown in FIG. 25, the capacitor 3 of the present embodiment includes two tubular portions 34 (34a, 34b).

The through holes 33 (33a, 33b) are formed inside each tubular portion 34a, 34b, respectively.

The two connecting portions 6a, 6b are formed at positions overlapping to the through holes 33a, 33b in the Z direction, respectively.

When manufacturing the electric power converter 1, two connecting portions 6a, 6b are fastened by inserting the fastening members 13 into the two through holes 33a, to 33b, respectively, from the bottom wall portion 311 side.

According to the present structure, since it is possible to further increase the surface area of the sealing member 32, it is possible to enhance the cooling efficiency of the capacitor elements 30.

Further, the frame 70, the laminated body 10 or the like is not interfering during a fastening operation of two connecting portions 6a, 6b.

Therefore, the fastening operation can be carried out easily.

The remainder has the same structure, functions and effects as in the first embodiment.

What is claimed is:

1. An electric power converter comprising:
a semiconductor module having a built-in semiconductor element;
a capacitor having a capacitor element and a capacitor terminal connected to the capacitor element; and
a DC bus bar that electrically connects the semiconductor module and the capacitor terminal; wherein,
the capacitor terminal and the DC bus bar are connected to each other at least at two connecting portions;
the DC bus bar includes a bus bar main body portion that is connected to the semiconductor module, and the two connecting portions are connected by at least a portion of the bus bar main body portion; and
the capacitor terminal includes a terminal main body portion that is connected to the capacitor element, and the two connecting portions are connected by at least a portion of the terminal main body portion.

2. The electric power converter according to claim 1, wherein,
a bus bar connecting portion that connects the two connecting portions among the bus bar main body portion and a terminal connecting portion that connects the two connecting portions among the terminal main body portion are overlapped with each other.

3. The electric power converter according to claim 1, wherein,
the capacitor includes a capacitor case for housing the capacitor element and a sealing member for sealing the capacitor element in the capacitor case; and
the terminal connecting portion that connects the two connecting portions among the terminal main body portion is disposed in the capacitor case.

4. The electric power converter according to claim 3, wherein,
the terminal connecting portions is sealed by the sealing member; and
a part of the sealing member exists between the terminal connecting portion and the bus bar main body portion.

5. The electric power converter according to claim 1, wherein,
a through hole penetrating in a thickness direction of the connecting portion is formed in the condenser;
at least one of the connecting portions among the two connecting portions is disposed at a position overlapping the through hole in the thickness direction; and
the one of the connecting portions is fastened by inserting a fastening member in the through hole from a side opposite to a side where the one of the connecting portions is disposed.

* * * * *